(12) United States Patent
Sunaga et al.

(10) Patent No.: US 9,331,041 B2
(45) Date of Patent: May 3, 2016

(54) SEMICONDUCTOR DEVICE AND SEMICONDUCTOR DEVICE MANUFACTURING METHOD

(71) Applicant: ROHM CO., LTD., Kyoto-shi, Kyoto (JP)

(72) Inventors: Takeshi Sunaga, Kyoto (JP); Akihiro Kimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 171 days.

(21) Appl. No.: 13/961,323

(22) Filed: Aug. 7, 2013

(65) Prior Publication Data
US 2013/0320527 A1 Dec. 5, 2013

Related U.S. Application Data

(63) Continuation-in-part of application No. PCT/JP2012/052870, filed on Feb. 8, 2012.

(30) Foreign Application Priority Data

Feb. 8, 2011 (JP) .................................. 2011-024849
Feb. 8, 2011 (JP) .................................. 2011-024850
Feb. 8, 2011 (JP) .................................. 2011-024851

(51) Int. Cl.
*H01L 23/00* (2006.01)
*H01L 23/31* (2006.01)
(Continued)

(52) U.S. Cl.
CPC .............. *H01L 24/16* (2013.01); *H01L 21/568* (2013.01); *H01L 23/3114* (2013.01); *H01L 23/3121* (2013.01); *H01L 23/49541* (2013.01); *H01L 23/49548* (2013.01); *H01L 23/49575* (2013.01); *H01L 24/17* (2013.01); *H01L 24/81* (2013.01); *H01L 24/97* (2013.01);
(Continued)

(58) Field of Classification Search
CPC ................. H01L 2224/16; H01L 2924/01079; H01L 2924/01078; H01L 2924/15311; H01L 2924/14; H01L 25/0657; H01L 25/50; H01L 2224/48091; H01L 24/16; H01L 23/49548; H01L 23/49541; H01L 23/49575; H01L 24/97; H01L 24/17; H01L 24/81; H01L 21/568; H01L 23/3121; H01L 23/3114; H01L 23/3107; H01L 2224/73253; H01L 2224/97

See application file for complete search history.

(56) References Cited

U.S. PATENT DOCUMENTS 7,335,529 B2 2/2008 Miyaki et al.
7,691,672 B2 * 4/2010 Hatano ............... H01L 21/6835
257/E21.48

(Continued)

FOREIGN PATENT DOCUMENTS

| JP | 2001-144241 | 5/2001 |
|---|---|---|
| JP | 2003-303919 | 10/2003 |
| JP | 2004-172157 | 6/2004 |
| JP | 2006-93577 | 4/2006 |
| JP | 2006-295114 | 10/2006 |
| JP | 2009-246395 | 10/2009 |
| JP | 2009-302209 | 12/2009 |

*Primary Examiner* — Michelle Mandala
(74) *Attorney, Agent, or Firm* — Hamre, Schumann, Mueller & Larson, P.C.

(57) ABSTRACT

A semiconductor device includes a semiconductor chip, and a terminal connected with the semiconductor chip. The terminal has a first surface and a second surface spaced from each other in a thickness direction. The semiconductor device also includes a sealing resin covering the semiconductor chip and the terminal. The sealing resin is so configured that the first surface of the terminal is exposed from the sealing resin. The terminal is formed with an opening to be filled with the sealing resin.

38 Claims, 21 Drawing Sheets

(51) Int. Cl.
*H01L 21/56* (2006.01)
*H01L 23/495* (2006.01)

(52) U.S. Cl.
CPC .. *H01L 23/3107* (2013.01); *H01L 2224/16245* (2013.01); *H01L 2224/32145* (2013.01); *H01L 2224/32245* (2013.01); *H01L 2224/45144* (2013.01); *H01L 2224/48091* (2013.01); *H01L 2224/48247* (2013.01); *H01L 2224/49171* (2013.01); *H01L 2224/73253* (2013.01); *H01L 2224/73265* (2013.01); *H01L 2224/97* (2013.01)

(56) References Cited

U.S. PATENT DOCUMENTS

| | | | |
|---|---|---|---|
| 2002/0017725 A1* | 2/2002 | Isozaki | 257/772 |
| 2002/0096790 A1* | 7/2002 | Kasuya | H01L 23/49503 257/787 |
| 2004/0166605 A1* | 8/2004 | Kuratomi et al. | 438/106 |
| 2006/0225918 A1 | 10/2006 | Chinda et al. | |
| 2009/0134206 A1* | 5/2009 | Schmitt et al. | 228/198 |
| 2009/0309201 A1 | 12/2009 | Morita | |
| 2012/0086111 A1* | 4/2012 | Iwamoto et al. | 257/666 |

\* cited by examiner

SEMICONDUCTOR DEVICE AND SEMICONDUCTOR DEVICE MANUFACTURING METHOD

BACKGROUND OF THE INVENTION

1. Field of the Invention

The present invention relates to semiconductor devices and methods of making semiconductor devices.

2. Description of the Related Art

Packaged semiconductor devices called SON (Small Outline Non-leaded Package) or QFN (Quad Flat Non Leaded Package) have been widely manufactured. FIG. 32 shows a QFN semiconductor device in a sectional view (see JPA-2009-246395). The semiconductor device X in FIG. 32 includes a resin case 91, a base lead 92, a semiconductor chip 93, lead terminals 94, and connection wires 95. The semiconductor chip 93 is fixed to the base lead 92, and is connected with the lead terminals 94 via the connection wires 95. The semiconductor device X as described above is manufactured by using a lead frame. The lead frame is a metal plate having a thickness of about 0.2 mm, formed into a desired pattern by e.g., precision punching or etching.

When manufacturing the semiconductor device X using a lead frame, a semiconductor chip 93 is placed on a base lead 92, then the semiconductor chip 93 is connected with lead terminals 94 by connection wires 95, and the lead frame is covered with a resin case 91. Thereafter, unnecessary portions of the lead frame are cut and removed.

For producing small electronic devices, the semiconductor device X is also subjected to size reduction and increased functionality. One way to reduce the size is to reduce the thickness of the semiconductor device X. In making a thinner semiconductor device X, the thicknesses of the base lead 92 and the lead terminals 94 can be a disadvantage. To address this, proposals have been made for manufacturing packaged semiconductor devices without using a lead frame. For this, terminals may be made on a metal base by plating, and then the base may be removed by etching.

However, when the terminals are formed not by using a lead frame but by plating as described above, the terminals will have a thickness of about 20 μm, and may readily be pulled out of the resin case. Thus, it is necessary to ensure great pull-out resistance of the terminals in manufacturing semiconductor devices without using lead frames.

SUMMARY OF THE INVENTION

The present invention has been proposed under the above-described circumstances, and it is therefore an object of the present invention to provide a semiconductor device suitable for size reduction, and to provide a method of making such a semiconductor device.

A first aspect of the present invention provides a semiconductor device which includes: a semiconductor chip; a terminal connected with the semiconductor chip; and a sealing resin which covers the semiconductor chip and the terminal. In this device, the sealing resin exposes a surface of the terminal in a direction of a thickness of the terminal, and the terminal has an opening which is filled with the sealing resin.

According to a preferred embodiment of the present invention, the opening may be a hole which extends throughout the terminal in the thickness direction.

According to another preferred embodiment of the present invention, the opening is provided by a recess which recedes in a direction perpendicular to the thickness direction as viewed in the thickness direction.

According to a more preferable embodiment of the present invention, the semiconductor device further includes a wire which connects the semiconductor chip with the terminal. With the above arrangement, the terminal has a pad area for the wire connection, and the pad area is farther than the opening is, from the semiconductor chip in a direction perpendicular to the thickness direction.

According to a more preferable embodiment of the present invention, the terminal is elongate in a first direction which is perpendicular to the thickness direction, the terminal has a width in a second direction which is perpendicular to the thickness direction and the first direction, where the width decreases as proceeding away from the semiconductor chip in the first direction.

According to a preferred embodiment of the present invention, the semiconductor device further includes a support member which supports the semiconductor chip via a surface thereof in the thickness direction. The support member has a surface which faces in the thickness direction and this surface is exposed from the sealing resin.

Preferably, the support member may contain silver.

Preferably, the terminal is formed of a plurality of metal layers.

According to a more preferred embodiment of the present invention, the semiconductor chip has a surface which faces in the thickness direction and is bonded to the support member whereas the semiconductor chip has another surface which faces in the thickness direction and is provided with an additional semiconductor chip.

More preferably, the semiconductor device further includes an additional terminal connected with the additional semiconductor chip. The additional terminal has a surface which faces its thickness direction and is exposed from the sealing resin.

More preferably, the additional terminal has an opening which is filled with the sealing resin.

According to a preferred embodiment, the additional opening is provided by a hole which extends throughout the terminal in the thickness direction.

According to another preferred embodiment, the additional opening is provided by a recess which recedes in a direction perpendicular to the thickness direction as viewed in the thickness direction.

Preferably, the semiconductor device further includes an additional wire connecting the additional semiconductor chip with the additional terminal. The additional terminal has a pad area for the wire connection, and the pad area is farther than the additional opening is, from the semiconductor chip in a direction perpendicular to the thickness direction.

Preferably, the semiconductor device further includes a fixing member which fixes the additional semiconductor chip to the semiconductor chip. The fixing member may be provided by a DAF tape.

A second aspect of the present invention provides a method of making a semiconductor device. The method includes: a step of forming a terminal on a base; a step of placing a semiconductor chip on the base; a step of sealing the terminal and the semiconductor chip with a resin; and a step of removing the base. In this method, the step of forming a terminal includes making an opening in the terminal for exposure of the base as viewed in a thickness direction of the base.

According to a preferred method, the step of forming a terminal on a base includes performing an electroless plating process to the base.

According to a preferred embodiment of the method of manufacture, the opening is provided by a hole which extends throughout the terminal in the thickness direction.

According to another preferred embodiment of the method of manufacture, the opening is provided by a recess which recedes in a direction perpendicular to the thickness direction as viewed in the thickness direction.

More preferably, the method further includes a step of connecting the terminal with the semiconductor chip. The terminal has a pad area for the wire connection, and the pad area is farther than the opening is, from the semiconductor chip in a direction perpendicular to the thickness direction.

More preferably, the step of placing a semiconductor chip on the base includes bonding a surface of the semiconductor chip which faces in the thickness direction and is closer to the base, to the base via a bonding member. Further, in the step of connecting the terminal with the semiconductor chip, the wire is connected with an electrode terminal which is provided on another surface of the semiconductor chip which faces in the thickness direction.

For example, the bonding member is provided by a silver paste.

A more preferred method of manufacture includes a step of forming an additional terminal on the base; a step of placing an additional semiconductor chip on another surface of the first semiconductor device which faces in the thickness direction; and a step of connecting the additional semiconductor chip with the additional terminal. Further, the step of forming an additional terminal includes making an additional opening in the additional terminal for exposure of the base as viewed in a thickness direction of the base.

A third aspect of the present invention provides a semiconductor device which includes: a plurality of terminals; a first semiconductor chip; a second semiconductor chip on the first semiconductor chip; and a sealing resin which covers the first semiconductor chip, the second semiconductor chip and the terminals. These terminals include a first terminal connected with the first semiconductor chip and a second terminal connected with the second semiconductor chip. Each terminal has a surface which faces its thickness direction and is exposed from the sealing resin.

According to a preferred embodiment of the present invention, the semiconductor device further includes a support member which supports the first semiconductor chip via a surface thereof in the thickness direction. The support member has a surface which faces in the thickness direction and is exposed from the sealing resin.

For example, the support member contains silver.

According to a preferred embodiment of the present invention, the first semiconductor chip has a first electrode terminal on another surface which faces in the thickness direction. The semiconductor device further includes a first wire which connects the first electrode terminal with the first terminal.

More preferably, the first terminal has an opening which is filled with the sealing resin.

According to another preferred embodiment of the present invention, the first terminal is disposed at a place overlapped by the first semiconductor chip as viewed in the thickness direction, and the first semiconductor chip has a first electrode terminal on a surface which faces in the thickness direction. The semiconductor device further includes an electroconductive bonding member which connects the first electrode terminal with the first terminal.

For example, the electroconductive bonding member may be provided by a solder bump.

According to a preferred embodiment of the present invention, the second semiconductor chip has a surface which faces in the thickness direction and is fixed to the first semiconductor chip. Further, the second semiconductor chip has another surface which faces in the thickness direction and is provided with a second electrode terminal. The semiconductor device further includes a second wire which connects the second electrode terminal with the second terminal.

Preferably, the semiconductor device includes a fixing member which connects the second semiconductor chip with the first semiconductor chip.

For example, the fixing member may be provided by a DAF tape.

Preferably, the second terminal has an opening which is filled with the sealing resin.

Preferably, each of the terminals is formed of a plurality of metal layers.

A fourth aspect of the present invention provides a method of making a semiconductor device. The method includes: a step of forming a plurality of terminals on a base; a step of placing a first semiconductor chip on the base; a step of placing a second semiconductor chip on the first semiconductor chip; a step of sealing the first semiconductor chip, the second semiconductor chip and the terminals with a resin; and a step of removing the base.

According to a preferred method, the step of forming a plurality of terminals on a base includes performing an electroless plating process to the base.

Preferably, the first semiconductor chip has a first electrode terminal on a surface which faces in a thickness direction of the terminals and is farther from the base. Further, the step of placing a first semiconductor chip on the base includes bonding a surface of the first semiconductor chip which faces in the thickness direction and is closer to the base, to the base via a bonding member, and connecting the first electrode terminal with one of the terminals using a first wire.

For example, the bonding member may be provided by a silver paste.

Preferably, the step of forming a plurality of terminals on a base includes making an opening in each terminal for exposure of the base as viewed in a thickness direction of the base.

According to another preferred method of manufacture, the first semiconductor chip has a first electrode terminal on a surface which faces a thickness direction of the terminals and is closer to the base. Further, the step of placing a first semiconductor chip on the base includes connecting the first electrode terminal with one of the terminals using an electroconductive bonding member.

For example, the electroconductive bonding member may be provided by a solder bump.

According to a preferred embodiment, the terminals are formed in a grid pattern in the step of forming a plurality of terminals.

According to a preferred method of manufacture, the second semiconductor chip has a second electrode terminal on a surface which faces in the terminals' thickness direction and is farther from the base. The method includes a step of connecting the second electrode terminal with one of the terminals using a second wire.

According to a preferred method of manufacture, the step of placing a second semiconductor chip on the first semiconductor chip includes bonding a surface of the first semiconductor chip which faces in the terminals' thickness direction and is farther from the base with a surface of the second semiconductor chip which is closer to the base, using a fixing member.

For example, the fixing member may be provided by a DAF tape.

A fifth aspect of the present invention provides a semiconductor device which includes: a plurality of terminals; a first semiconductor chip; a second semiconductor chip on the first semiconductor chip; a third semiconductor chip on the second semiconductor chip; and a sealing resin which covers the first semiconductor chip, the second semiconductor chip, the third semiconductor chip and the terminals. These terminals include a first terminal connected with the first semiconductor chip, a second terminal connected with the second semiconductor chip, and a third terminal connected with the third semiconductor chip. Each of the terminals has a surface which faces its thickness direction and is exposed from the sealing resin.

According to a preferred embodiment of the present invention, the first terminal is disposed at a place overlapped by the first semiconductor chip as viewed in the thickness direction. The first semiconductor chip has a first electrode terminal on a surface which faces in the thickness direction. The semiconductor device includes an electroconductive bonding member which connects the first electrode terminal with the first terminal.

For example, the electroconductive bonding member may be provided by a solder bump.

For example, the terminals are arranged in a grid pattern as viewed in the thickness direction.

According to a preferred embodiment of the present invention, the semiconductor device further includes a support member which supports the first semiconductor chip via a surface thereof in the thickness direction. The support member has a surface which faces in the thickness direction and is exposed from the sealing resin.

For example, the support member may contain silver.

According to another preferred embodiment of the present invention, the first semiconductor chip has a first electrode terminal on another surface which faces in the thickness direction. The semiconductor device includes a first wire connecting the first electrode terminal with the first terminal.

Preferably, the first terminal has an opening which is filled with the sealing resin.

According to a preferred embodiment of the present invention, the second semiconductor chip has a surface which faces in the thickness direction and is fixed to the first semiconductor chip. The second semiconductor chip has another surface which faces in the thickness direction and is provided with a second electrode terminal. The semiconductor device further includes a second wire which connects the second electrode terminal with the second terminal.

Preferably, the second terminal has an opening which is filled with the sealing resin.

Preferably, the semiconductor device includes a first fixing member which connects the second semiconductor chip with the first semiconductor chip.

For example, the first fixing member may be provided by a DAF tape.

According to a preferred embodiment of the present invention, the third semiconductor chip has a surface which faces in the thickness direction and is fixed to the second semiconductor chip. The third semiconductor chip has another surface which faces in the thickness direction and is provided with a third electrode terminal. The semiconductor device includes a third wire which connects the third electrode terminal with the third terminal.

Preferably, the third terminal has an opening which is filled with the sealing resin.

Preferably, the semiconductor device includes a second fixing member which connects the third semiconductor chip with the second semiconductor chip.

For example, the second fixing member may be provided by a DAF tape.

Preferably, each of the terminals is formed of a plurality of metal layers.

A sixth aspect of the present invention provides a method of making a semiconductor device. The method includes: a step of forming a plurality of terminals on a base; a step of placing a first semiconductor chip on the base; a step of placing a second semiconductor chip on the first semiconductor chip; a step of placing a third semiconductor chip on the second semiconductor chip; a step of sealing the first semiconductor chip, the second semiconductor chip, the third semiconductor chip and the terminals with a resin; and a step of removing the base.

According to a preferred method, the step of forming a plurality of terminals on a base includes performing an electroless plating process to the base.

Preferably, the first semiconductor chip has a first electrode terminal on a surface which faces in the terminals' thickness direction and is closer to the base. The step of placing a first semiconductor chip on the base includes connecting the first electrode terminal with one of the terminals using an electroconductive bonding member.

For example, the electroconductive bonding member may be provided by a solder bump.

For example, the terminals are formed in a grid pattern in the step of forming a plurality of terminals on a base.

Preferably, the first semiconductor chip has a first electrode terminal on a surface which faces in the terminals' thickness direction and is farther from the base. Further, the step of placing a first semiconductor chip on a base includes bonding a surface of the first semiconductor chip which faces in the thickness direction and is closer to the base to the base via a bonding member, and connecting the first electrode terminal with one of the terminals using a first wire.

For example, the bonding member may be provided by a silver paste.

Preferably, the second semiconductor chip has a second electrode terminal on a surface which faces in the terminals' thickness direction and is farther from the base. The method includes a step of connecting the second electrode terminal with one of the terminals using a second wire.

Preferably, the third semiconductor chip has a third electrode terminal on a surface which faces in the terminals' thickness direction and is farther from the base. The method includes a step of connecting the third electrode terminal with one of the terminals using a third wire.

Preferably, the step of placing a second semiconductor chip on the first semiconductor chip includes bonding a surface of the first semiconductor chip which faces in the terminals' thickness direction and is farther from the base with a surface of the second semiconductor chip which is closer to the base using a first fixing member.

For example, the first fixing member may be provided by a DAF tape.

Preferably, the step of placing a third semiconductor chip on the second semiconductor chip includes bonding a surface of the second semiconductor chip which faces in the terminals' thickness direction and is farther from the base with a surface of the third semiconductor chip which is closer to the base using a second fixing member.

For example, the second fixing member may be provided by a DAF tape.

Other features and advantages of the present invention will become clearer from the following detailed description with reference to the accompanying drawings.

DETAILED DESCRIPTION OF THE PREFERRED EMBODIMENTS

Preferred embodiments of the present invention will be described below with reference to the drawings.

Figure 1:
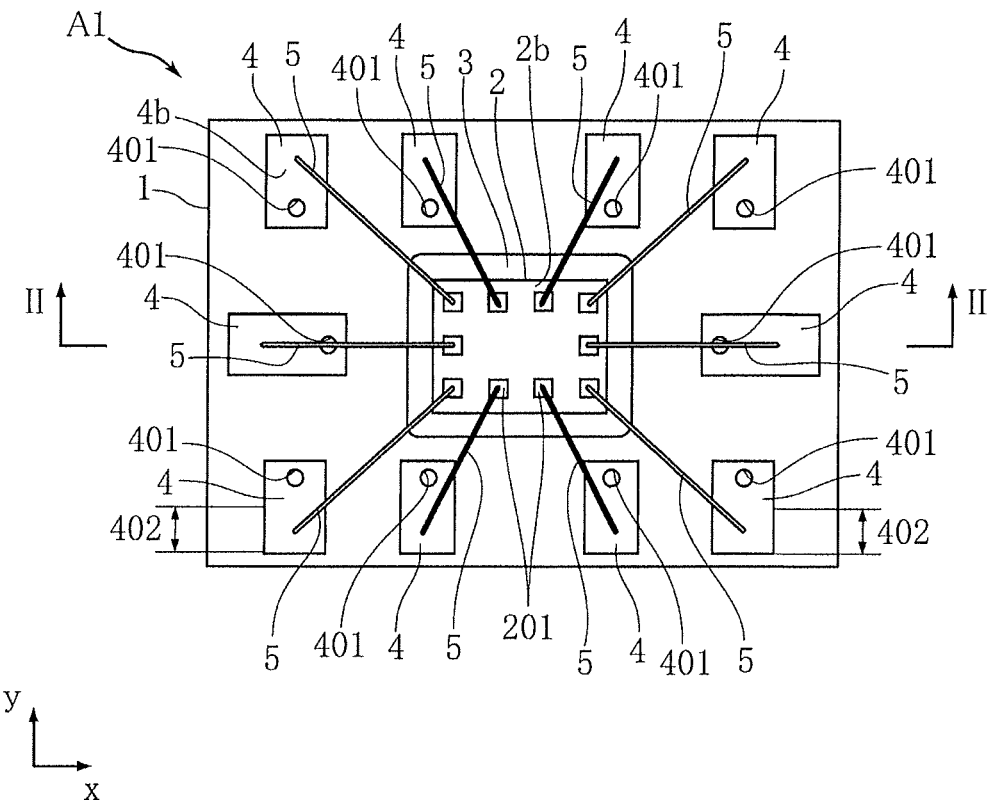
FIG. 1 is a plan view of a semiconductor device according to a first embodiment of the present invention.
Figure 2:
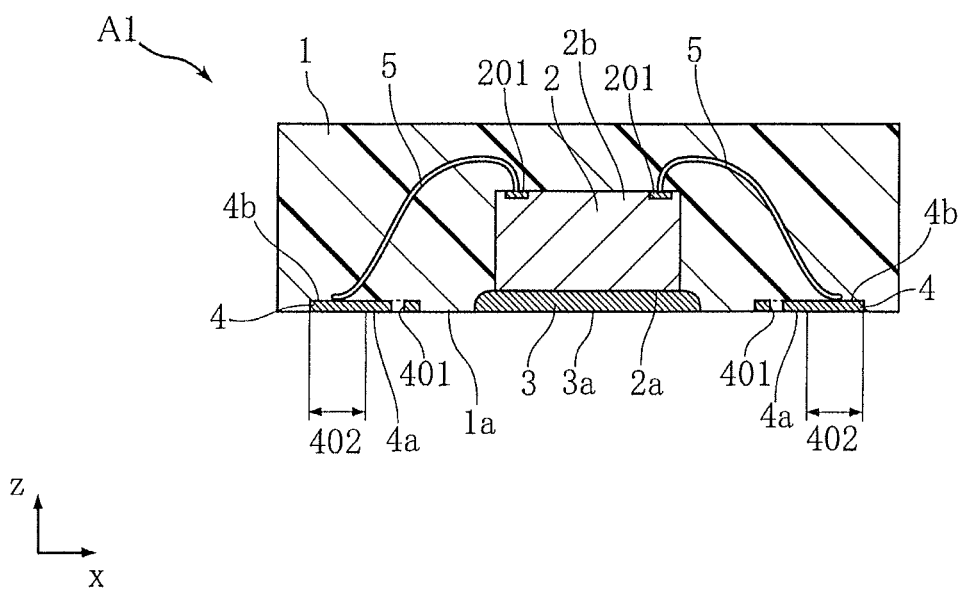
FIG. 2 is a sectional view taken in lines II-II in FIG. 1.
Figure 3:
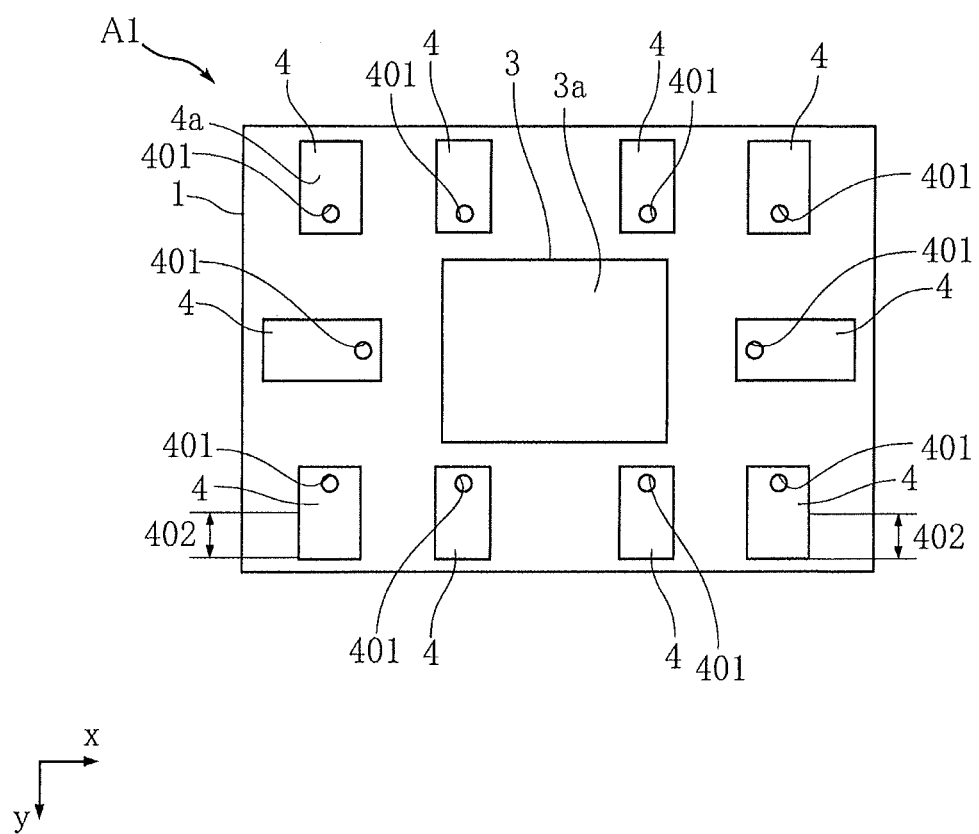
FIG. 3 is a bottom view of the semiconductor device in FIG. 1.

FIG. 1 through FIG. 3 show a semiconductor device according to a first embodiment of the present invention. The semiconductor device A1 of the present embodiment includes a sealing resin 1, a semiconductor chip 2, a support member 3, ten terminals 4, and ten wires 5. The sealing resin 1 is black for example, and the elements inside are invisible from the outside through the resin. For the sake of description, however, FIG. 1 shows the inside of the sealing resin 1. Directions x, y and z to be used in the following description are perpendicular to each other, where direction z is a thickness direction of the sealing resin 1, the semiconductor chip 2, the support member 3 and the terminals 4. Hereinafter, the lower side in direction z in FIG. 2 will be referred to as the bottom side, whereas the upper side in FIG. 2 will be referred to as the top side.

The sealing resin 1 covers the semiconductor chip 2 and each of the wires 5 entirely, while covering the support member 3 and each of the terminals 4 partly such that the bottom surface 3a of the support member 3 and the bottom surface 4a of each terminal 4 are exposed from the resin. The sealing resin 1 is made of epoxy resin for example, and is formed into a rectangular parallelepiped, elongated in direction x in FIG. 1. As an example, the sealing resin 1 has a dimension of 2.10 mm in direction x, a dimension of 1.60 mm in direction y and a dimension of 0.35 through 0.4 mm in direction z. These dimensions may be changed according to the size of the semiconductor chip 2.

The semiconductor chip 2 is made of a semiconductor material such as Si, and formed with a microcircuit in it. The semiconductor chip 2 has a bottom surface 2a and a top surface 2b facing away from each other in direction z. The bottom surface 2a is lower than the top surface 2b in FIG. 2. The bottom surface 2a of the semiconductor chip 2 is fixed to the support member 3. The top surface 2b of the semiconductor chip 2 is formed with ten electrode terminals 201. The ten electrode terminals 201 are disposed in a rectangular pattern as viewed in direction z. Each electrode terminal 201 is connected with the microcircuit in the semiconductor chip 2. The semiconductor chip 2 may be incorporated in an electronic circuit for example. Upon incorporation, each of the electrode terminals 201 is connected with wiring in the electronic circuit so that the semiconductor chip 2 functions. It should be noted here that the number of the electrode terminals 201 may be changed according to the function of the semiconductor chip 2.

The support member 3 is made of silver for example, rectangular as viewed in direction z as depicted in FIGS. 1 and 3, and disposed at a center of the semiconductor device A1 in directions x and y. Further, as shown in FIG. 2, the bottom surface 3a of the support member 3 is located at the same position as the bottom surface 1a of the sealing resin 1 in direction z.

As shown in FIG. 1, the ten terminals 4 are disposed in a rectangular pattern surrounding the semiconductor chip 2. Each terminal 4 is rectangular as viewed in direction z and connected with one of the electrode terminals 201 by a gold wire 5. In order to avoid situations where the wires 5 make undesired contact with each other, each terminal 4 is apart from adjacent ones by 0.50 mm for example. To provide such a distance, two of the terminals 4 disposed at the center in direction y are disposed lengthwise in direction x while the other terminals 4 are disposed lengthwise in direction y. Each terminal 4 has a longitudinal dimension of 0.35 mm for example. The number of the terminals 4 is determined in accordance with the number of the electrode terminals 201 in the semiconductor chip 2, and may be changed according to the function of the semiconductor chip 2.

Though not illustrated in FIG. 2 for simplicity, each terminal 4 is formed of metal layers laminated by electroless plating for example. A preferable combination of the metal layers for the formation of the terminal 4 is a gold layer, a nickel layer and a palladium layer. In the formation, the gold layer is made on the side facing the bottom surface 4a, the nickel layer is made in the center, and the palladium layer is made on the side facing the top side 4b. Each terminal 4 formed in this way has a thickness of 0.015 mm for example.

Each terminal 4 is formed with an opening 401. FIG. 1 shows an embodiment where the opening 401 is circular as viewed in direction z and penetrating in direction z. Each opening 401 is filled with the sealing resin 1. The opening 401 has a diameter of about 0.06 through 0.07 mm. As shown in FIG. 1, in each terminal 4 the opening 401 is formed near a longitudinal end of the terminal 4 which is closer to the semiconductor chip 2.

Each terminal 4 has a pad area 402 for connection with the wire 5. The pad area 402 is a region which includes a longitudinal end of the terminal 4 which is farther from the semiconductor chip 2. Each pad area 402 has a length of 0.21 mm for example, along the longitudinal direction of the terminal 4. The length of the pad area 402 is determined so that the wire 5 is properly disposed. The opening 401 is near a longitudinal end of the terminal 4 which is closer to the semiconductor chip 2 so as not to interfere with the disposition of the wire 5. The pad area 402 is at a relatively farther location from the semiconductor chip 2 since this arrangement makes easy the placement of the wire 5.

Next, a method for manufacturing the semiconductor device A1 will be described with reference to FIG. 4 through FIG. 8.

A base 6 is used when manufacturing semiconductor devices A1. The base 6 is a copper plate having a thickness of about 0.125 mm in direction z for example. As viewed in direction z, the base 6 is rectangular and large enough to include a large number of semiconductor devices A1.

Figure 4:
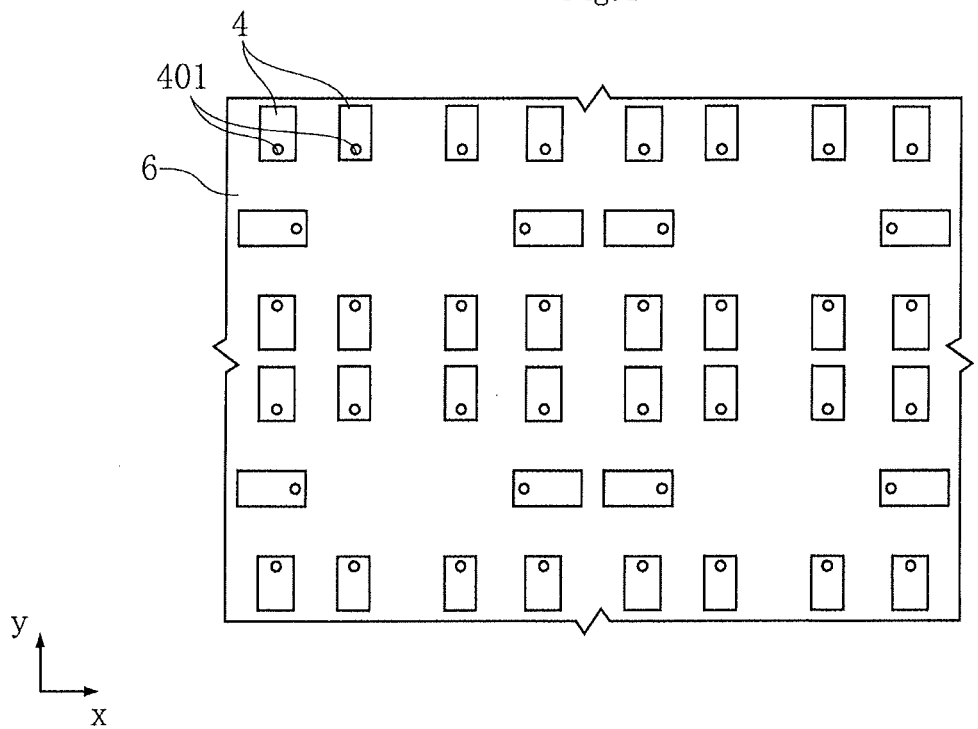
FIG. 4 is a plan view of a primary portion, showing a state that terminals are formed on a base according to an embodiment of a method of making the semiconductor device in FIG. 1.

When making semiconductor devices A1, first, the base 6 is prepared and a step of forming terminals 4 on a top surface of the base 6 is performed. In forming the terminals 4, an electroless plating process for example is employed to form a layer of metal over the entire top surface of the base 6. Thereafter, the metal layer is etched into desired shapes. In this manner, a large number of the terminals 4 are formed on the base 6 as shown in FIG. 4.

Figure 5:
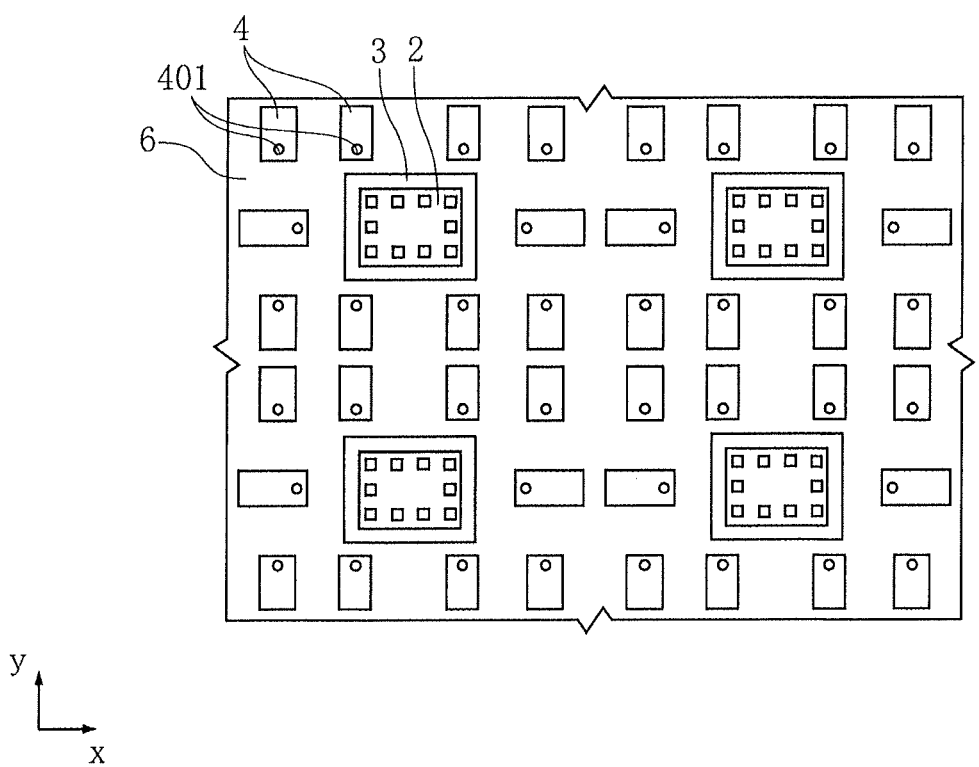
FIG. 5 is a plan view of a primary portion, showing a state that semiconductor chips are mounted according to the embodiment of the method of making the semiconductor device in FIG. 1.

Next, a step of placing semiconductor chips 2 on the base 6 is performed. FIG. 5 shows a state where the semiconductor chips 2 are placed on the base 6. In this step, first, an adhesive material provided by a silver paste is applied to the bottom surfaces of the semiconductor chips 2. Next, as shown in FIG. 5, each semiconductor chip 2 is placed at one of the regions surrounded by terminals 4. The adhesive material serves as a support member 3 after it hardens.

Figure 6:
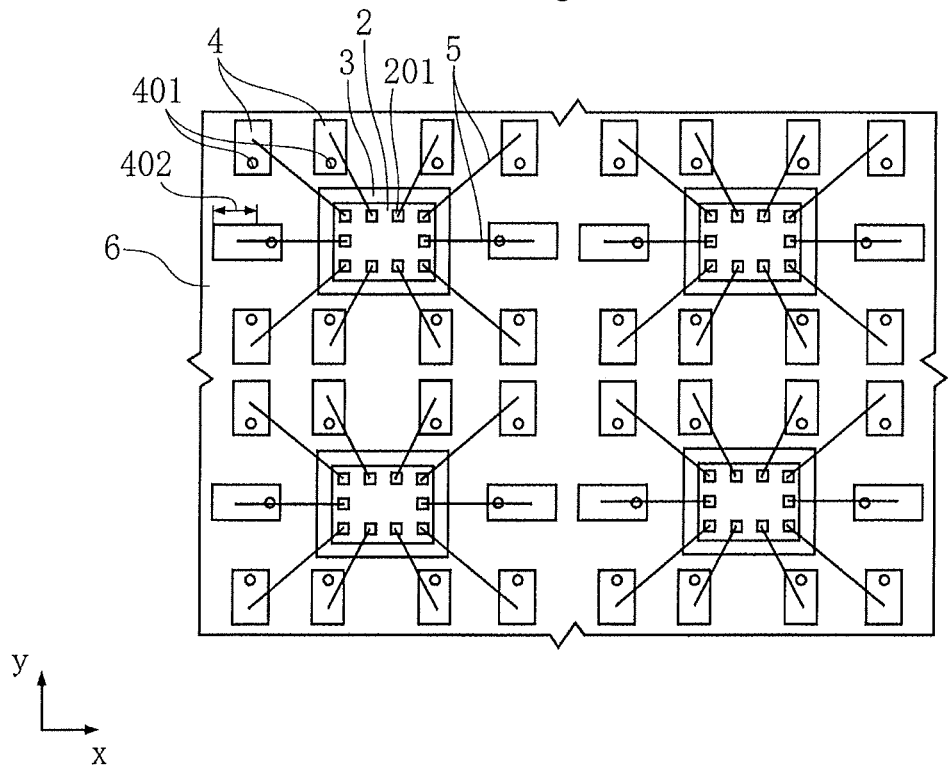
FIG. 6 is a plan view of a primary portion, showing a state that semiconductor chips are connected with the terminals via wires according to the embodiment of the method of making the semiconductor device in FIG. 1.

Next, a step of connecting the semiconductor chips 2 with the terminals 4 using wires 5 is performed. FIG. 6 shows a state after the wires 5 are connected. As shown in FIG. 6, each semiconductor chip 2 has ten electrode terminals 201. In this step, each electrode terminal 201 is connected with one of the terminals 4 by placing a wire 5 across the terminal and the corresponding pad area 402. This step can be performed by using a commercially available wire bonding capillary for example.

Figure 7:
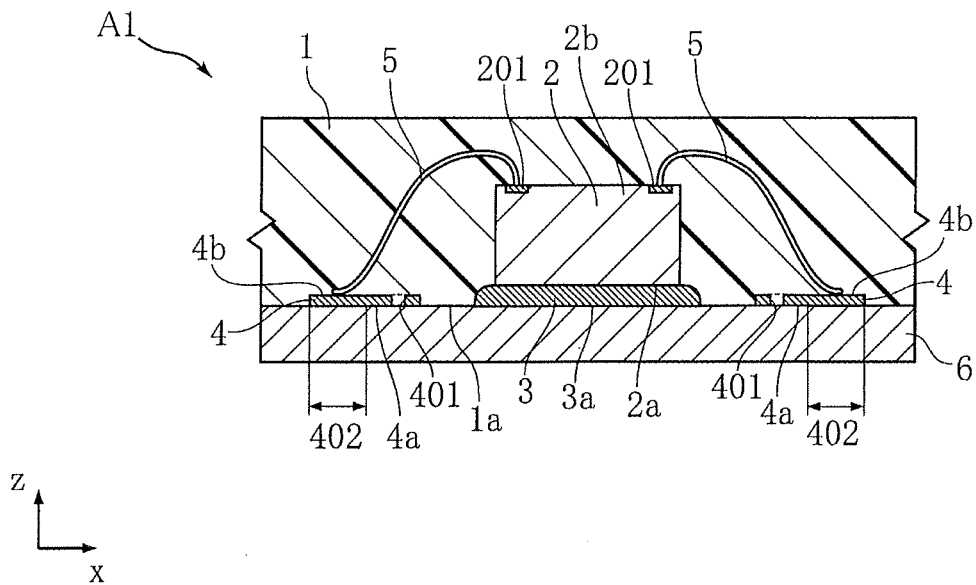
FIG. 7 is a sectional view of a primary portion, showing a state that a sealing resin is formed according to an example of a method of making the semiconductor device in FIG. 1.

Next, a step of forming a sealing resin 1 is performed. FIG. 7 shows a state after the sealing resin 1 is formed. This step can be performed by a transfer molding method for example. In this method, the base 6 is placed in a metal mold, and then a liquid epoxy resin is poured into the mold. In this process, the liquid epoxy resin flows also into the openings 401.

Figure 8:
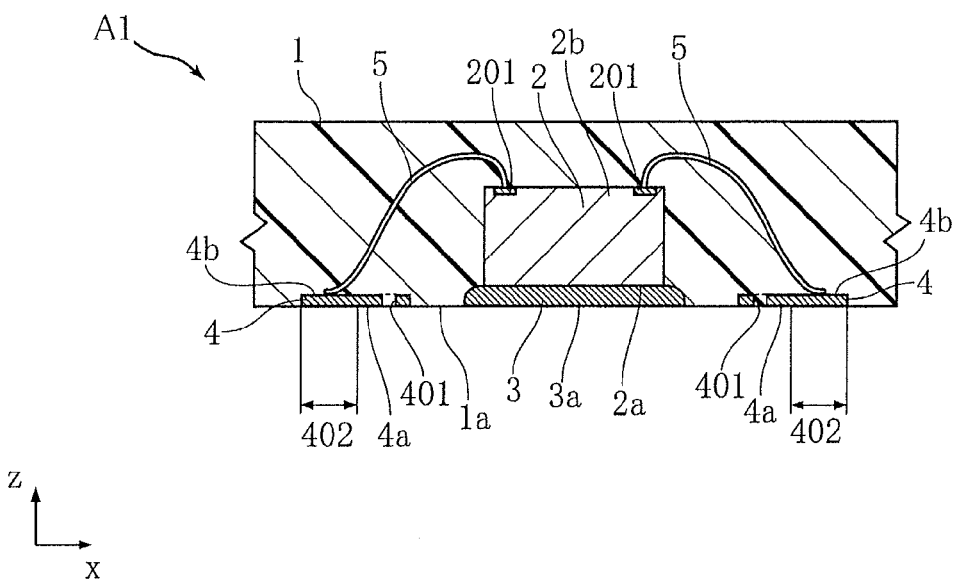
FIG. 8 is a sectional view of a primary portion, showing a state that the base is removed according to the embodiment of the method of making the semiconductor device in FIG. 1.

Next, a step of removing the base 6 is performed. FIG. 8 shows a state after the base 6 is removed. The step of removing the base 6 is performed by etching the base 6 from the bottom surface side. It should be noted here that the etching process may be replaced by mechanical grinding or chemically dissolving the copper with a liquid remover. As shown in FIG. 8, this step exposes the bottom surface 3a of the support member 3 and the bottom surface 4a of each terminal 4 in the bottom surface 1a of the sealing resin 1.

Under the state shown in FIG. 8, the sealing resin 1 has the same size as the base 6 as viewed in direction z. The sealing resin 1 shown in FIG. 8 is cut into pieces to provide the semiconductor devices A1 as shown in FIG. 1.

Next, the function of the semiconductor device A1 and the method of making the device will be described.

Since each terminal 4 is formed on the surface of the base 6 by plating, the thickness of each terminal 4 is thinner than the thickness of the terminal 94 in the semiconductor device X presented as a conventional example. Also, the method described above includes aspects contribute to decreasing the thickness of the device.

In the present embodiment, each terminal 4 is formed with an opening 401, and the opening 401 is filled with the sealing resin 1. In comparison with the case where there is no opening 401 provided, there is a larger area of contact between the terminal 4 and the sealing resin 1. Because of this arrangement, a larger friction works between the terminal 4 and the sealing resin 1, which makes each of the terminals 4 less likely to come off the sealing resin 1. Therefore, according to the arrangement incorporated in the semiconductor device A1, it is possible to solve the conventional problem resulting from the reduced thickness of the terminal, and to improve reliability.

In the present embodiment, the semiconductor chip 2 is mounted on the support member 3, and the bottom surface 3a thereof is exposed from the sealing resin 1. Further, the support member 3 is made of silver which has good thermal conductivity. Therefore, heat generated by the semiconductor chip 2 during operation is quickly released out of the semiconductor device A1 through the support member 3.

FIG. 9 through FIG. 31 show other embodiments and a variation of the present invention. In these figures, elements identical with or similar to those in the previous embodiment are indicated by the same reference symbols as in the previous embodiment.

Figure 9:
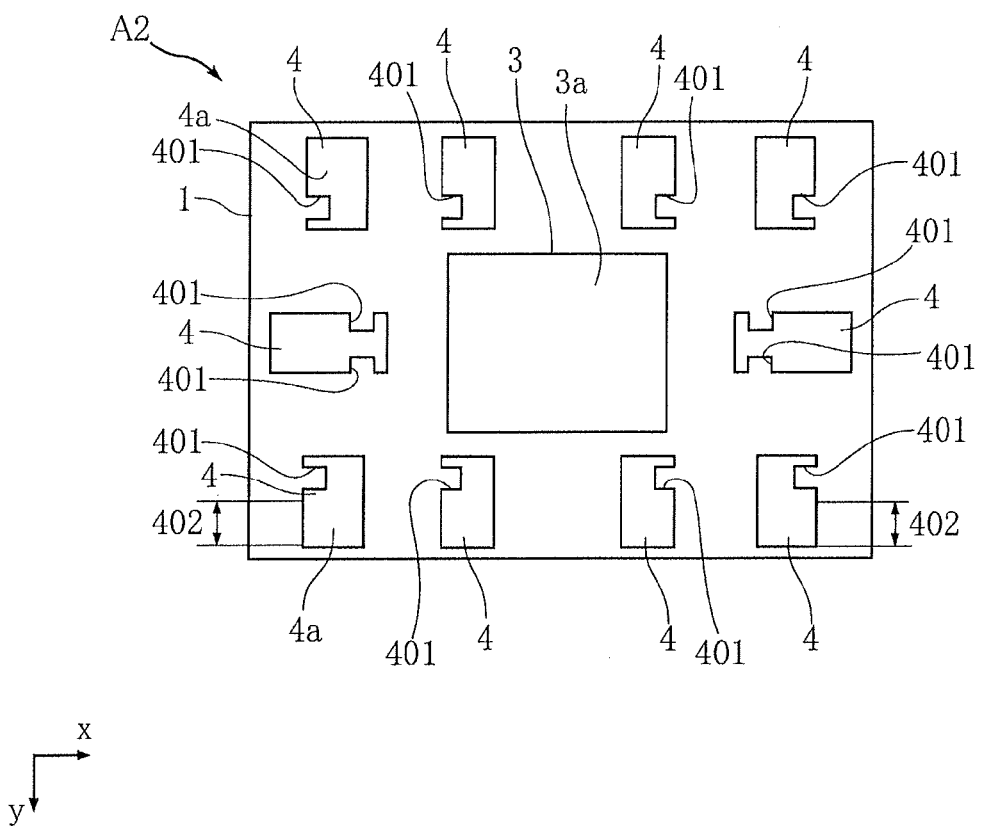
FIG. 9 is a bottom view of a semiconductor device according to a second embodiment of the present invention.

FIG. 9 shows a semiconductor device according to a second embodiment of the present invention. The present embodiment offers a semiconductor device A2, which differs from the semiconductor device A1 in the shape of the opening 401 in each terminal 4, with all the other arrangements being identical with those of the semiconductor device A1.

As shown in FIG. 9, the opening 401 in the present embodiment is rectangular as viewed in direction z, and is shaped as a recess from a longer side of the terminal 4 receding in the direction of the shorter sides. In the embodiment in FIG. 9, each of the terminals 4 located at a center in direction y has the opening 401 on both sides in direction y. This is because it is easier to give a larger width to the center terminals 4 than the other terminals 4. When it is possible to keep a sufficient width, the opening 401 may be made on both sides of other terminals 4.

Figure 10:
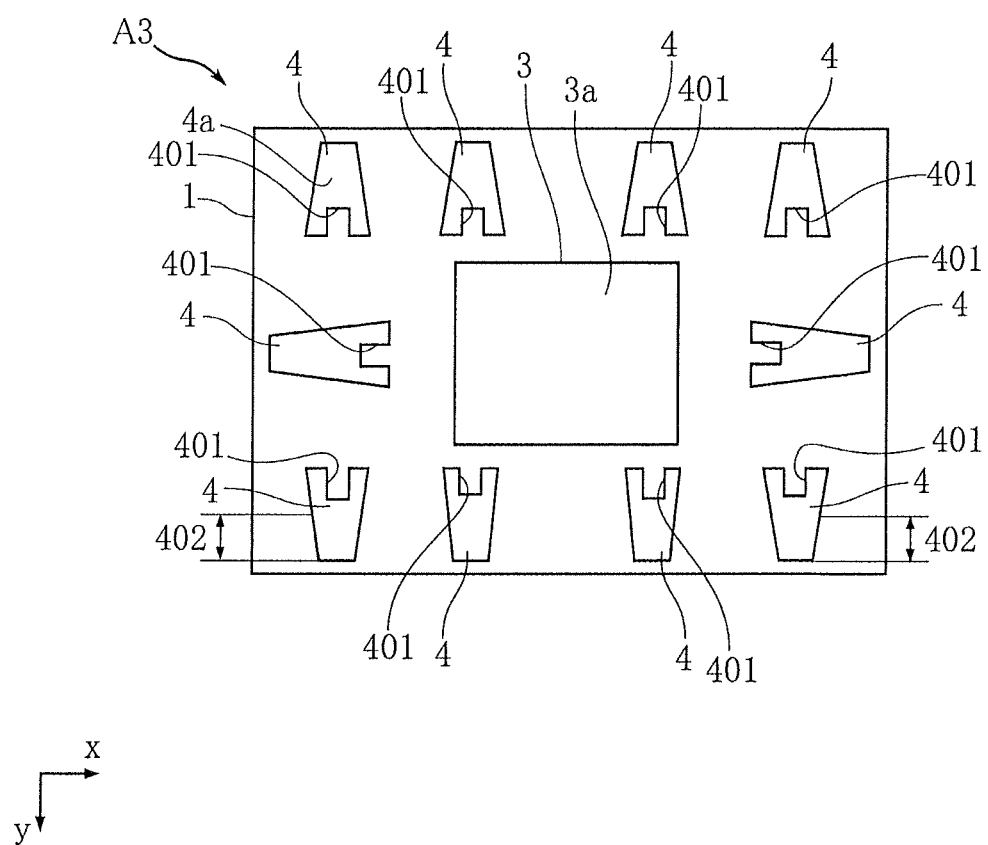
FIG. 10 is a bottom view of a semiconductor device according to a third embodiment of the present invention.

FIG. 10 shows a semiconductor device according to a third embodiment of the present invention. The semiconductor device A3 of this embodiment differs from the semiconductor device A1 in the shape of the terminal 4 and the shape of the opening 401, while all the other arrangements are identical with those of the semiconductor device A1.

Note that the shape of the opening 401 shown in FIG. 10 is only an example. In the present embodiment, the opening 401 may be an inward recess from an edge of the terminal 4, but the shape as viewed in direction z may be any shape. In the embodiment of FIG. 10, the opening 401 is provided by a recess made in a shorter side of the terminal 4 and receding in the longitudinal direction. However, the recess may be made in a longer side to recede in the width direction.

As shown in FIG. 10, each terminal 4 in the present embodiment has its width becoming shorter as it is away from the semiconductor chip 2 in its longitudinal direction. Each opening 401 is formed in an end edge of the terminal 4 which is closer to the semiconductor chip 2 in the longitudinal direction of the terminal, and the opening recedes inward in the longitudinal direction.

According to the present embodiment, it is possible to make the openings 401 relatively large. This arrangement is preferable in increasing the area of contact between the terminal 4 and the sealing resin 1.

Figure 11:
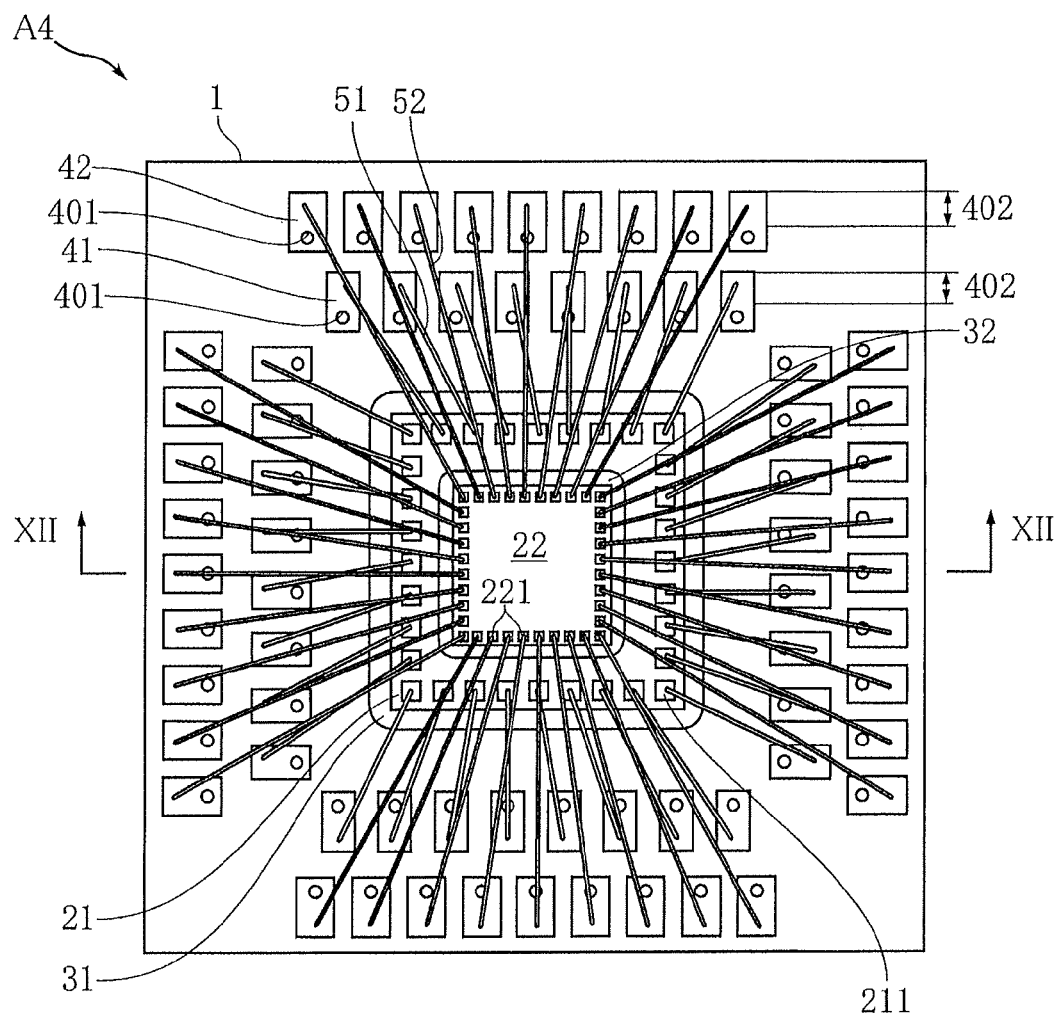
FIG. 11 is a plan view of a semiconductor device according to a fourth embodiment of the present invention.
Figure 12:
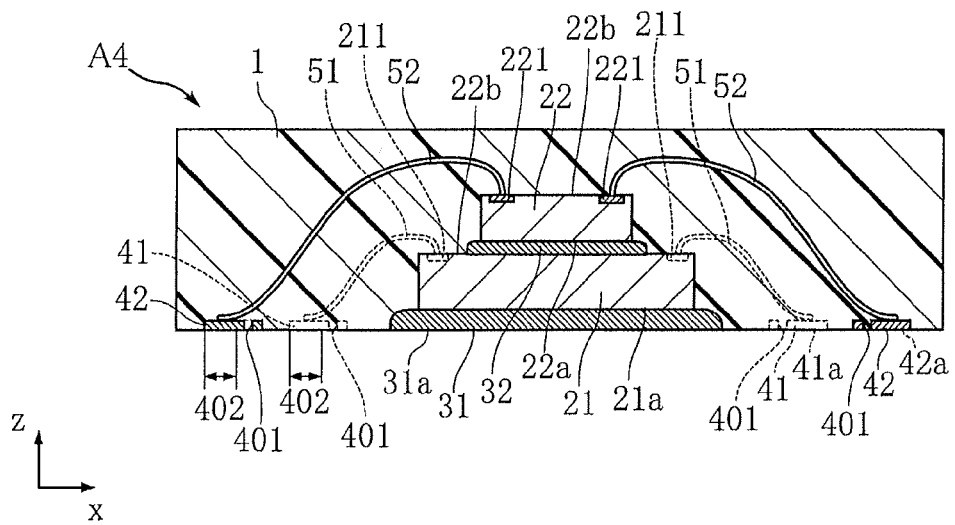
FIG. 12 is a sectional view taken in lines XII-XII in FIG. 11.

FIG. 11 and FIG. 12 show a semiconductor device according to a fourth embodiment of the present invention. The semiconductor device A4 of the present embodiment includes a sealing resin 1, two semiconductor chips 21, 22, a support member 31, a fixing member 32, thirty-two terminals 41, thirty-six terminals 42, thirty-two wires 51, and thirty-six wires 52.

The sealing resin 1 covers the semiconductor chips 21, 22, the fixing member 32 and all of the wires 51, 52 entirely while covering the support member 31 and the terminals 41, 42 partly so that the bottom surface 31a of the support member 31 and the bottom surfaces 41a, 42a of all the terminals 41, 42 are exposed. The sealing resin 1 is made of an epoxy resin for example and is formed into a square as viewed in direction z.

The semiconductor chip 21 is made of a semiconductor material such as Si, and formed with a microcircuit in it. The semiconductor chip 21 has a bottom surface 21a and a top surface 21b facing away from each other in direction z. The bottom surface 21a is lower than the top surface 21b in FIG. 12. The bottom surface 21a of the semiconductor chip 21 is fixed to the support member 31. The top surface 21b of the semiconductor chip 21 is formed with thirty-two electrode terminals 211. The thirty-two electrode terminals 211 are disposed in a rectangular pattern as viewed in direction z. Each electrode terminal 211 is connected with the microcircuit in the semiconductor chip 21. The semiconductor chip 21 is incorporated in an electronic circuit for example. Upon incorporation, each of the electrode terminals 211 is connected with wiring in the electronic circuit so that the semiconductor chip 21 functions. It should be noted here that the number of the electrode terminals 211 may be changed according to the function of the semiconductor chip 21.

The support member 31 is formed of a silver paste for example. As shown in FIG. 11, the support member 31 is substantially rectangular as viewed in direction z and is disposed at a center of the semiconductor device A4 in directions x and y. Further, as shown in FIG. 12, the support member 31 has a bottom surface 31a at an identical position as the bottom surface 1a of the sealing resin 1 in direction z.

The semiconductor chip 22 is made of a semiconductor material such as Si, and formed with a microcircuit in it. The semiconductor chip 22 has a bottom surface 22a and a top surface 22b facing away from each other in direction z. The bottom surface 22a is lower than the top surface 22b in FIG. 12. The semiconductor chip 22 has a smaller size than the semiconductor chip 21 as viewed in direction z. The bottom surface 22a of the semiconductor chip 22 is fixed to the top surface 21b of the semiconductor chip 21 via the fixing member 32. The top surface 22b of the semiconductor chip 22 is formed with thirty-six electrode terminals 221. The thirty-six electrode terminals 221 are disposed in a rectangular pattern as viewed in direction z. Each electrode terminal 221 is connected with the microcircuit in the semiconductor chip 22. The semiconductor chip 22 is incorporated in an electronic circuit together with the semiconductor chip 22. Upon incorporation, each of the electrode terminals 221 is connected with wiring in the electronic circuit so that the semiconductor chip 22 functions. It should be noted here that the number of the electrode terminals 221 may be changed according to the function of the semiconductor chip 22.

The fixing member 32 is provided by Die Attach Film tape (DAF tape) for example. As shown in FIG. 11, the fixing member 32 is substantially rectangular as viewed in direction z and is disposed inside the rectangular frame pattern made by the thirty-two electrode terminals 211.

As shown in FIG. 11, the thirty-two terminals 41 are disposed in a frame-like pattern to surround the semiconductor chips 21, 22. In the embodiment shown in FIG. 11, the thirty-two terminals 41 are grouped into four lines each consisting of eight terminals 41. Two of the four lines have their eight terminals 41 disposed in direction x whereas the other two lines have their terminals disposed in direction y. Each terminal 41 is rectangular as viewed in direction z, and the terminals 41 are disposed side by side in their width direction. Like the terminals 4 in the semiconductor device A1, each terminal 41 has an opening 401 and a pad area 402. Each terminal 41 has its pad area 402 connected with one of the electrode terminals 211 using a gold wire 51. The number of the terminals 41 is determined in accordance with the number of the electrode terminals 211 in the semiconductor chip 21, and may be changed according to the function of the semiconductor chip 21.

As shown in FIG. 11, the thirty-six terminals 42 are disposed in a frame-like pattern to surround the pattern made by the thirty-two the terminals 41. In the embodiment shown in FIG. 11, the thirty-six terminals 42 are grouped into four lines each consisting of nine terminals 42. Two of the four lines have their nine terminals 42 disposed in direction x whereas the other two lines have the terminals disposed in direction y. Each terminal 42 is rectangular as viewed in direction z, and the terminals 42 are disposed side by side in their width direction. Like the terminals 4 in the semiconductor device A1 described earlier, each terminal 42 is formed with an opening 401 and has a pad area 402. Each terminal 42 has its pad area 402 connected with one of the electrode terminals 221 using a gold wire 52. The number of the terminals 42 is determined in accordance with the number of the electrode terminals 221 in the semiconductor chip 22, and may be changed according to the function of the semiconductor chip 22.

Though not illustrated in FIG. 12 for simplicity, each of the terminals 41, 42 is formed of metal layers like the terminals 4 in the semiconductor device A1. Each terminal formed in this way has a thickness of 0.015 mm for example.

Next, a method for manufacturing the semiconductor device A4 will be described with reference to FIG. 13 through FIG. 17.

When making the semiconductor device A4, the base 6 is used as with the semiconductor device A1.

Figure 13:
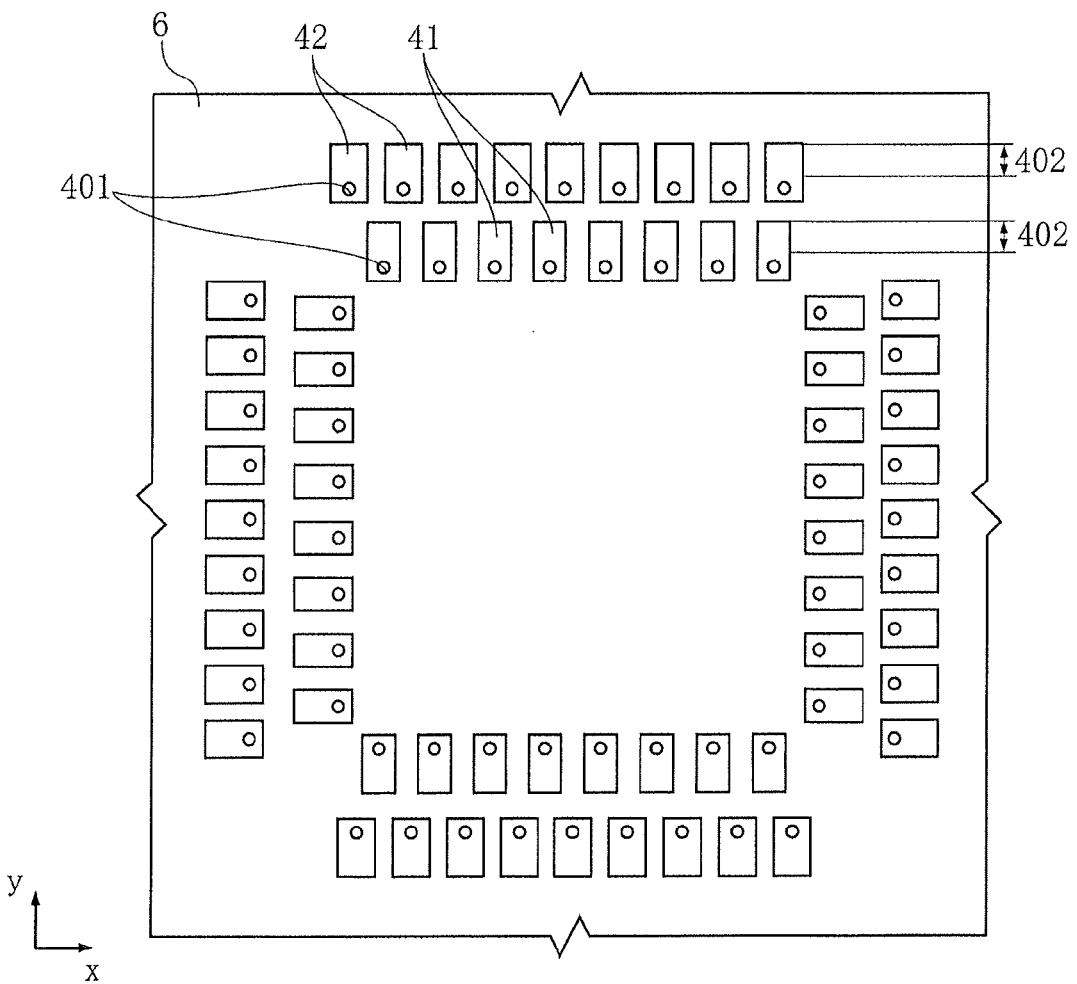
FIG. 13 is a plan view of a primary portion, showing a state that terminals are formed on a base according to an embodiment of the method of making the semiconductor device in FIG. 11.

When making the semiconductor device A4, first, the base 6 is prepared and a step of forming terminals 41, 42 on a top surface of the base 6 is performed. FIG. 13 shows a state where the terminals 41, 42 are formed. This step can be generally the same as the step of forming the terminals 4 when making the semiconductor device A1. Namely, an electroless plating process is followed by formation of the openings 401. In the present step, a coating material for exposing the terminals 41, 42 is applied to the base 6.

Figure 14:
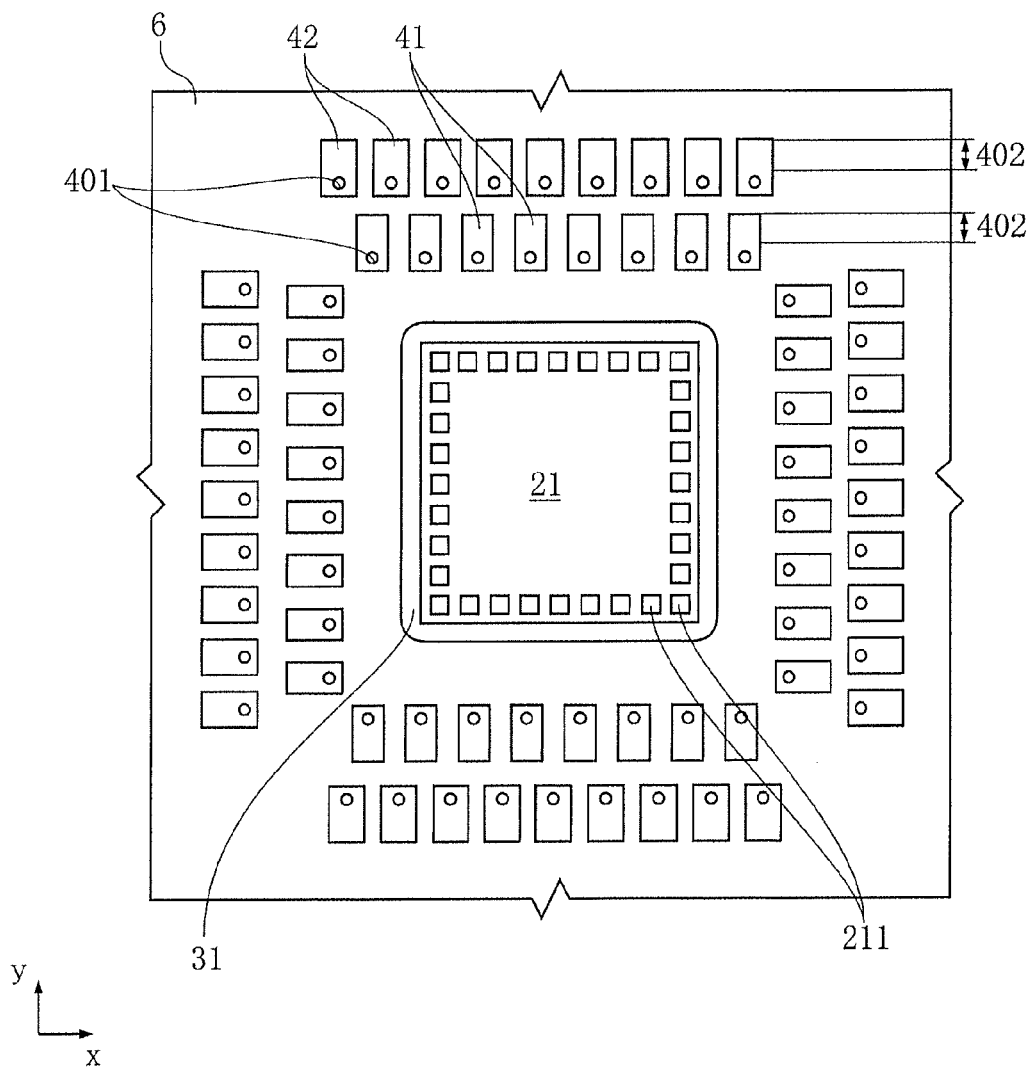
FIG. 14 is a plan view of a primary portion, showing a state that a semiconductor chip is mounted according to the embodiment of the method of making the semiconductor device in FIG. 11.

Next, a step of placing semiconductor chips 21 on the base 6 is performed. FIG. 14 shows a state where the semiconductor chip 21 is placed on the base 6. In this step, first, an adhesive material provided by a silver paste is applied on the bottom surfaces of the semiconductor chips 21. Next, as shown in FIG. 14, a semiconductor chip 21 is then placed at each of the regions surrounded by the terminals 41. The adhesive material serves as a support member 31 after it hardens.

Figure 15:
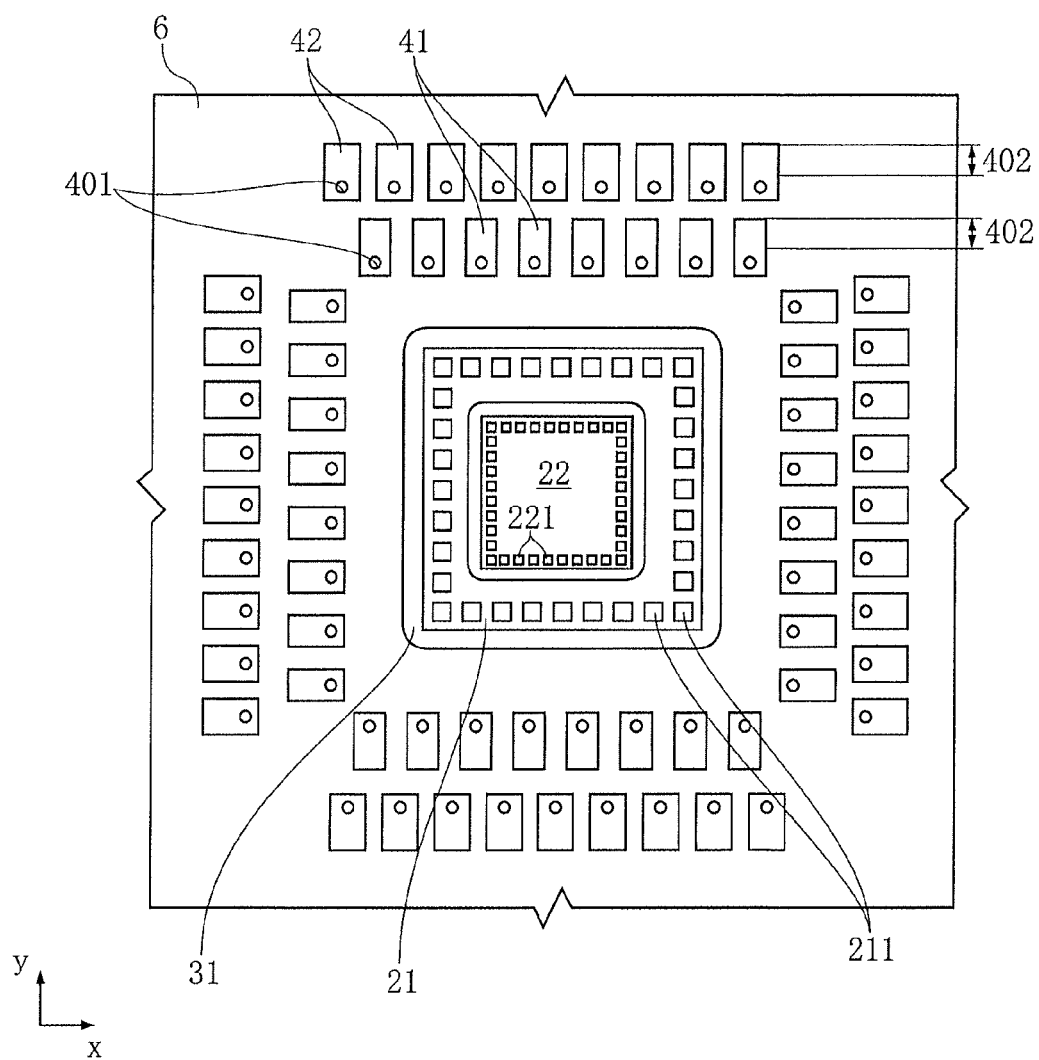
FIG. 15 is a plan view of a primary portion, showing a state that an additional semiconductor chip is mounted according to the embodiment of the method of making the semiconductor device in FIG. 11.

Next, a step of placing a semiconductor chip 22 on the semiconductor chip 21 is performed. FIG. 15 shows a state where the semiconductor chip 22 is placed on the semiconductor chip 21. In this step, first, a DAF tape is applied on the bottom surface of each semiconductor chip 22. Next, as shown in FIG. 15, each semiconductor chip 22 is placed at a region surrounded by the terminals 211. The DAF tape will become a fixing member 32.

Figure 16:
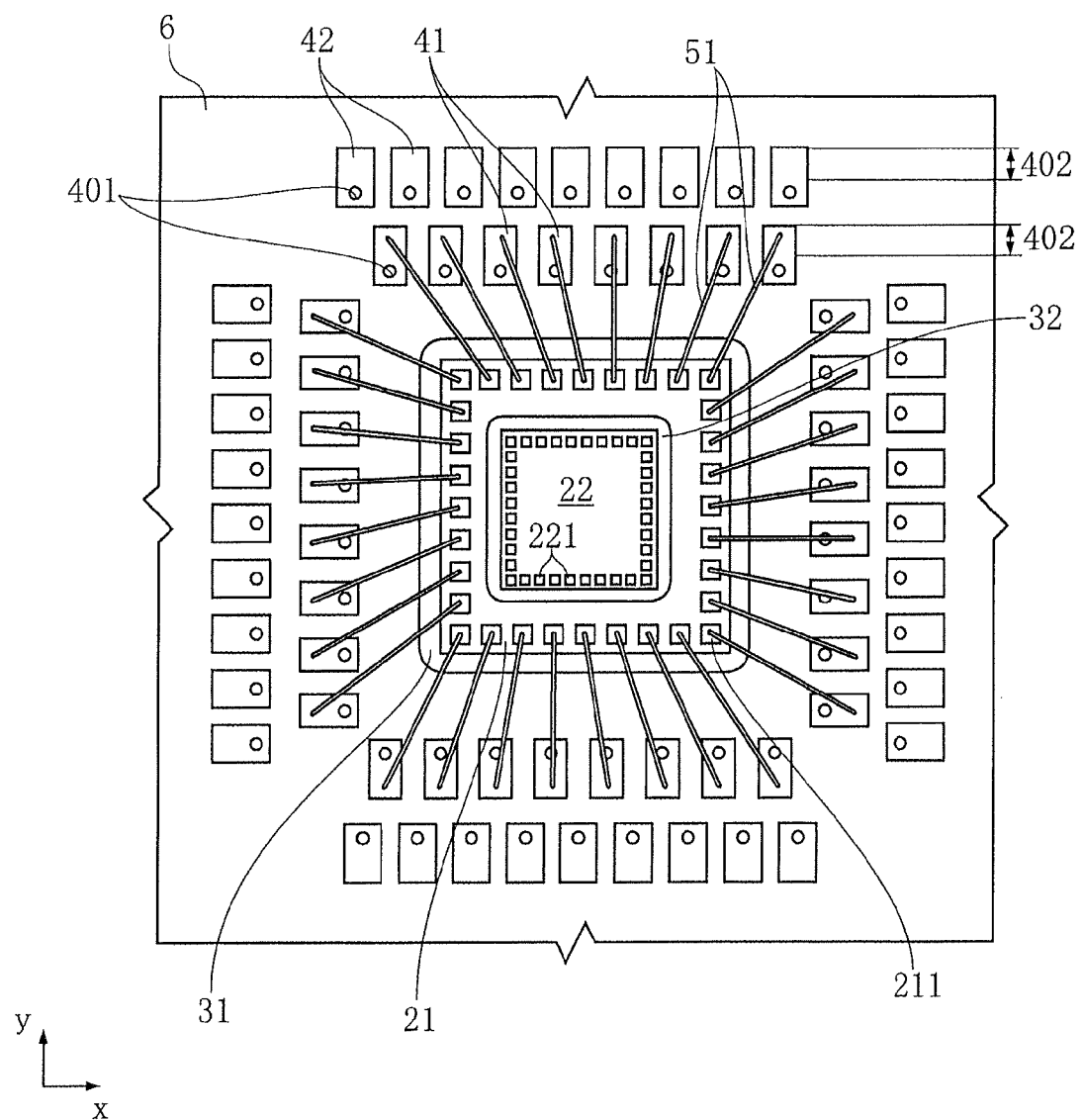
FIG. 16 is a plan view of a primary portion, showing a state that the semiconductor chip is connected with the terminals via wires according to the embodiment of the method of making the semiconductor device in FIG. 11.

Next, a step of connecting the semiconductor chip 21 with the terminals 41 using wires 51 is performed. FIG. 16 shows a state after the wires 51 are placed. As shown in FIG. 16, the semiconductor chip 21 has thirty-two electrode terminals 211. In this step, each electrode terminal 211 is connected with one of the terminals 41 by placing a wire 51 across the terminal and a corresponding pad area 402. The placement of the wires 51 can be performed by using a commercially available wire bonding capillary for example.

Figure 17:
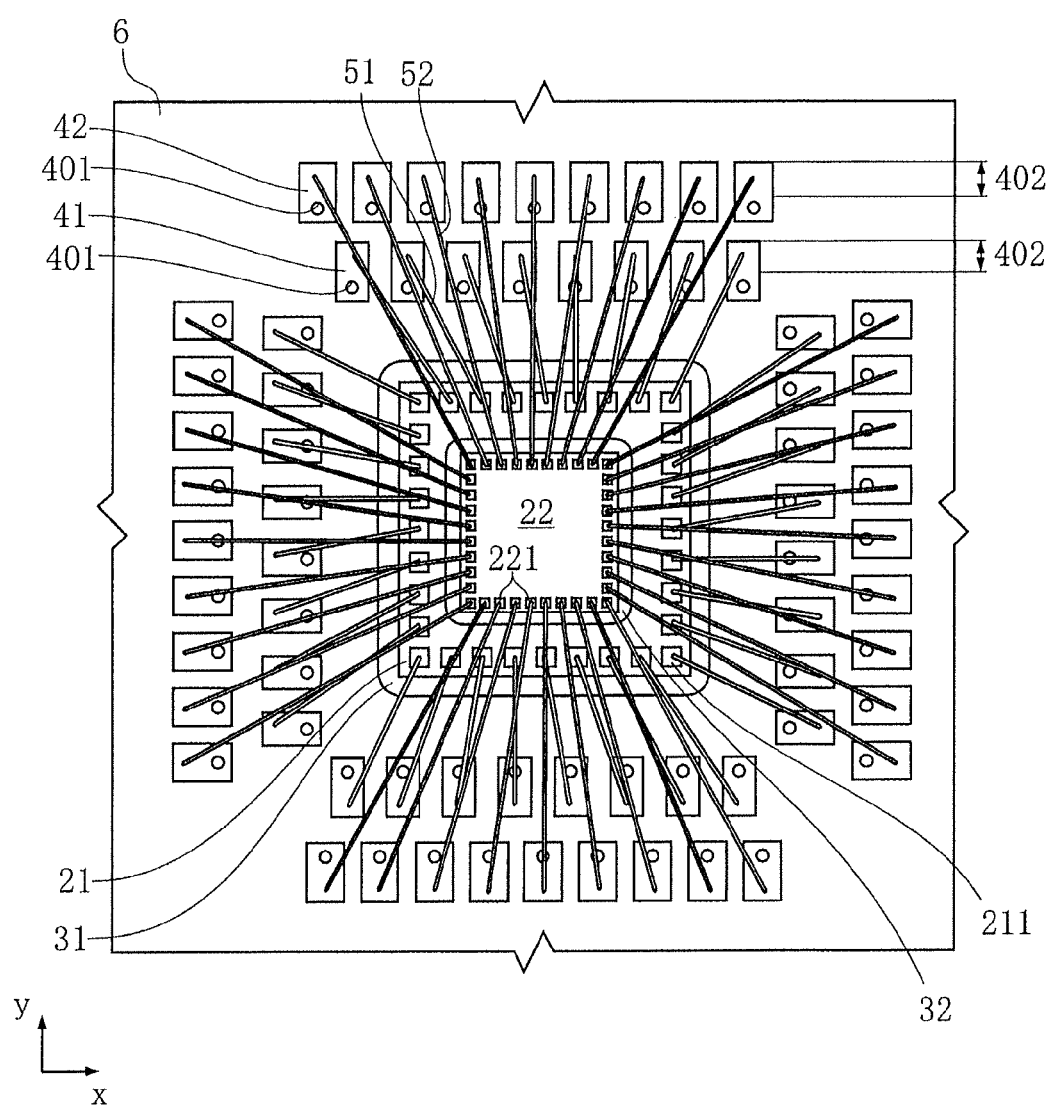
FIG. 17 is a plan view of a primary portion, showing a state that the additional semiconductor chip is connected with the terminals via additional wires according to the embodiment of the method of making the semiconductor device in FIG. 11.

Next, a step of connecting the semiconductor chip 22 with the terminals 42 using wires 52 is performed. FIG. 17 shows a state after the wires 52 are connected. As shown in FIG. 17, the semiconductor chip 22 has thirty-six electrode terminals 221. In this step, each electrode terminal 221 is connected with one of the terminals 42 by placing a wire 52 across the terminal and the corresponding pad area 402. This step can be performed by using a commercially available wire bonding capillary for example.

Next, a step of forming a sealing resin 1 is performed. This step can be performed in the same way as described for the method of making the semiconductor device A1, i.e. the step can be performed by a transfer molding method for example.

Next, a step of removing the base 6 is performed. This step can be performed in the same way as described for the method of making the semiconductor device A1, i.e. the step can be performed by etching the base 6 from the bottom surface side. After the base is removed, the sealing resin 1 is cut into pieces to obtain the semiconductor device A4 shown in FIG. 11 and FIG. 12.

Next, the functions of the semiconductor device A4 and the method of making the device will be described.

The semiconductor device A4 is incorporated in a circuit substrate of a various kind of electronic devices. In order to decrease the size of the circuit board, it is effective to incorporate as many semiconductor chips within a given area. According to the semiconductor device A4, a semiconductor chip 22 is fixed on a top surface 21b of a semiconductor chip 21. The arrangement serves to increase the number of semiconductor chips per unit area as compared to cases where two semiconductor chips 21, 22 are individually sealed in a resin and then incorporated in an electronic circuit. Therefore, the semiconductor device A4 has a beneficial arrangement for decreasing the size of the circuit board.

Figure 18:
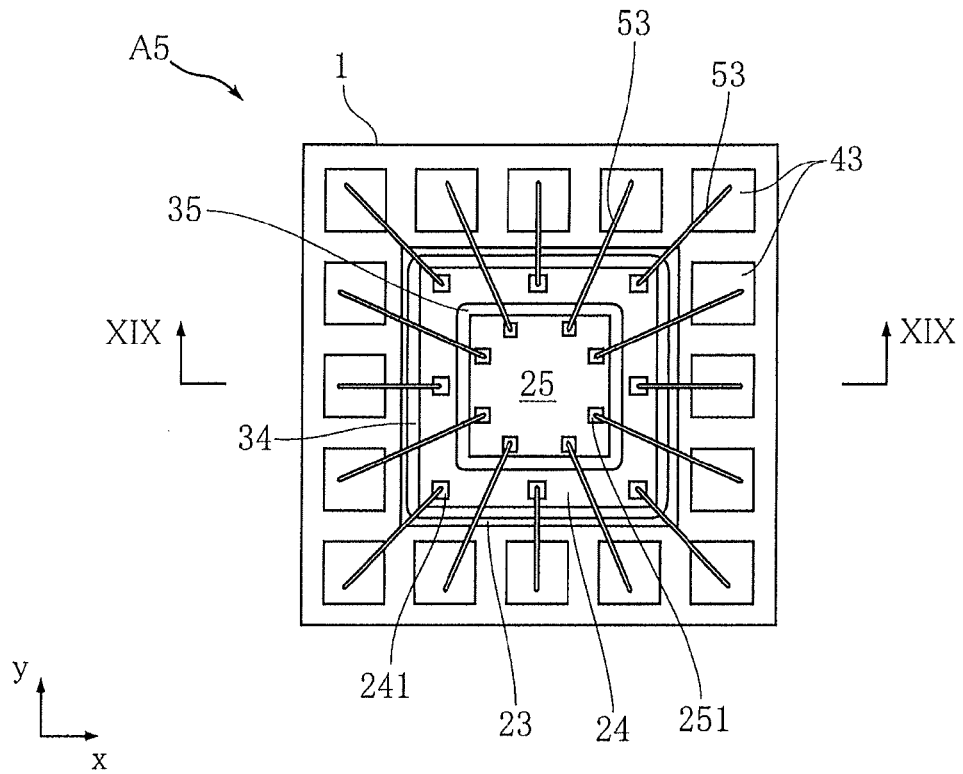
FIG. 18 is a plan view of a semiconductor device according to a fifth embodiment of the present invention.
Figure 19:
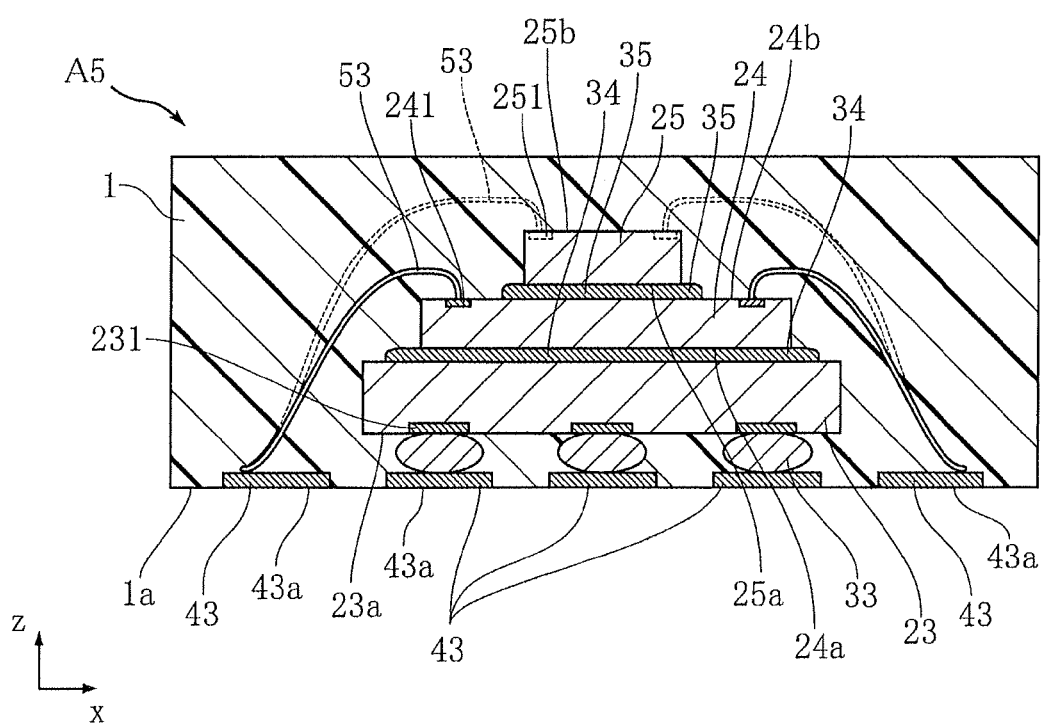
FIG. 19 is a sectional view taken in lines XIX-XIX in FIG. 18.
Figure 20:
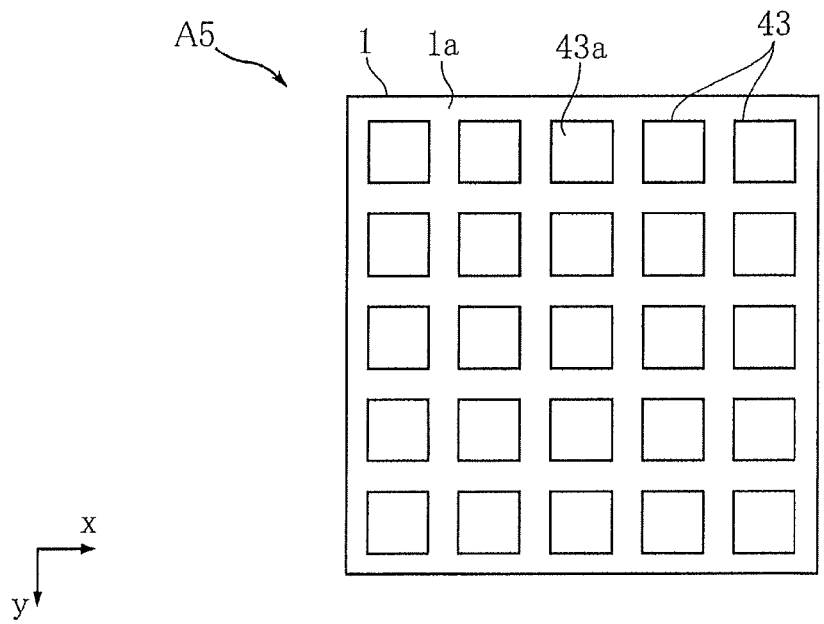
FIG. 20 is a bottom view of the semiconductor device in FIG. 18.

FIG. 18 through FIG. 20 show a semiconductor device according to a fifth embodiment of the present invention. The present embodiment offers a semiconductor device A4, which includes a sealing resin 1, three semiconductor chips 23, 24, 25, nine electroconductive support members 33, fixing members 34, 35, twenty-five terminals 43, and sixteen wires 53. The semiconductor device A5 is an area array semiconductor device, and as shown in FIG. 20, twenty-five terminals 43 are arranged in a grid pattern as viewed in direction z. Of the twenty-five terminals 43, sixteen terminals on the outside are connected with the semiconductor chips 24, 25 whereas nine terminals on the inside are connected with the semiconductor chip 23. In the present embodiment, each terminal 43 is square as viewed in direction z.

The sealing resin 1 covers the semiconductor chips 23, 24, 25, and all of the electroconductive bonding members 33, the fixing members 34, 35 and the wires 53 entirely while covering the terminals 43 partly to expose a bottom surface 43a of each terminal 43. The sealing resin 1 is made of an epoxy resin for example, and is formed into a square as viewed in direction z.

The semiconductor chip 23 is made of a semiconductor material such as Si, and formed with a microcircuit in it. The semiconductor chip 23 has a bottom surface 23a and a top surface 23b facing away from each other in direction z. The bottom surface 23a is lower than the top surface 23b in FIG. 19. In the embodiment in FIG. 18, the semiconductor chip 23 is square as viewed in direction z and is disposed inside of a rectangular frame pattern made by the sixteen terminals 43. The semiconductor chip 23 has a bottom surface 23a provided with nine electrode terminals 231 arranged in a grid pattern as viewed in direction z. Each electrode terminal 231 is connected with a microcircuit formed in the semiconductor chip 23. The number of the electrode terminals 231 may be changed according to the function of the semiconductor chip 23.

Of the twenty-five terminals 43, nine terminals 43 on the inside are disposed at places overlapped by the semiconductor chip 23 as viewed in direction z. Specifically, the nine terminals 43 are disposed to face the nine electrode terminals 231 which are provided on the bottom surface 23a of the semiconductor chip 23.

Each electroconductive bonding member 33 is provided by a solder bump for example, and as shown in FIG. 19, bonds one of the terminals 43 with a corresponding one of the electrode terminals 231.

The semiconductor chip 24 is made of a semiconductor material such as Si, and formed with a microcircuit in it. The semiconductor chip 24 has a bottom surface 24a and a top surface 24b facing away from each other in direction z. The bottom surface 24a is lower than the top surface 24b in FIG. 19. In the embodiment shown in FIG. 18, the semiconductor chip 24 is a smaller square as viewed in direction z than the semiconductor chip 23. The bottom surface 24a of the semiconductor chip 24 is fixed to the top surface 23b of the semiconductor chip 23 via the fixing member 34. The top surface 24b of the semiconductor chip 24 is formed with eight electrode terminals 241. The eight electrode terminals 241 are disposed along a circumferential edge of a top surface 24b so as to provide an open area at a center region of the semiconductor chip 24 as viewed in direction z. In the embodiment shown in FIG. 18, the electrode terminals 241 are disposed along each side of the top surface 24b, at both ends and a center in each side. Each electrode terminal 241 is connected with a microcircuit formed in the semiconductor chip 24. The number of the electrode terminals 241 may be changed according to the function of the semiconductor chip 24.

The semiconductor chip 25 is made of a semiconductor material such as Si, and formed with a microcircuit in it. The semiconductor chip 25 has a bottom surface 25a and a top surface 25b facing away from each other in direction z. The bottom surface 25a is lower than the top surface 25b in FIG. 19. In the embodiment shown in FIG. 18, the semiconductor chip 25 is a smaller square as viewed in direction z than the semiconductor chip 24. The bottom surface 25a of the semiconductor chip 25 is fixed to the top surface 24b of the semiconductor chip 24 via the fixing member 35. The top surface 25b of the semiconductor chip 25 is formed with eight electrode terminals 251. In the embodiment in FIG. 18, the eight electrode terminals 251 are disposed at places not to be overlapped by the eight electrode terminals 241 as viewed in direction x or direction y. Each electrode terminal 251 is connected with a microcircuit formed in the semiconductor chip 25. The number of the electrode terminals 251 may be changed according to the function of the semiconductor chip 25.

The fixing members 34, 35 are provided by a DAF tape for example. As shown in FIG. 18, the fixing member 34 is substantially rectangular as viewed in direction z and covers most of a top surface 23b of the semiconductor chip 23. As mentioned above, the electrode terminals 231 of the semiconductor chip 23 are in the bottom surface 23a. Therefore, it is possible to size the fixing member 34 almost the same size as the semiconductor chip 23. This provides an advantage when a relatively large semiconductor chip 24 is placed on the semiconductor chip 23. The fixing member 35 is placed inside a frame defined by the eight electrode terminals 241.

As shown in FIG. 18, each of the electrode terminals 241, 251 is connected with one of the terminals 43, using a gold wire 53.

Next, a method for manufacturing the semiconductor device A5 will be described with reference to FIG. 21 through FIG. 26.

When making the semiconductor device A5, the base 6 is used as with the semiconductor devices A1 through A4.

Figure 21:
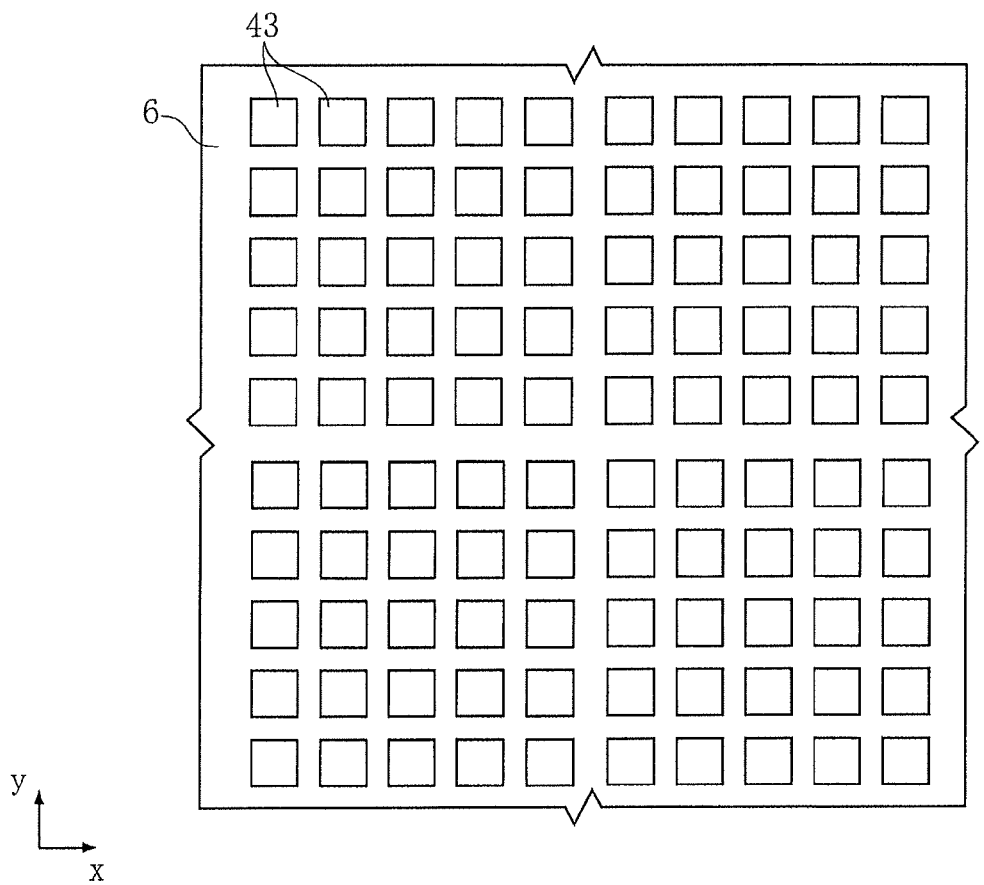
FIG. 21 is a plan view of a primary portion, showing a state that terminals are formed on a base according to an embodiment of the method of making the semiconductor device in FIG. 18.

When making the semiconductor device A5, first, the base 6 is prepared and a step of forming terminals 43 on a top surface of the base 6 is performed. FIG. 21 shows a state where the terminals 43 are formed. Like the step of forming the terminals 4 in the semiconductor device A1 this step is performed by employing an electroless plating process.

Figure 22:
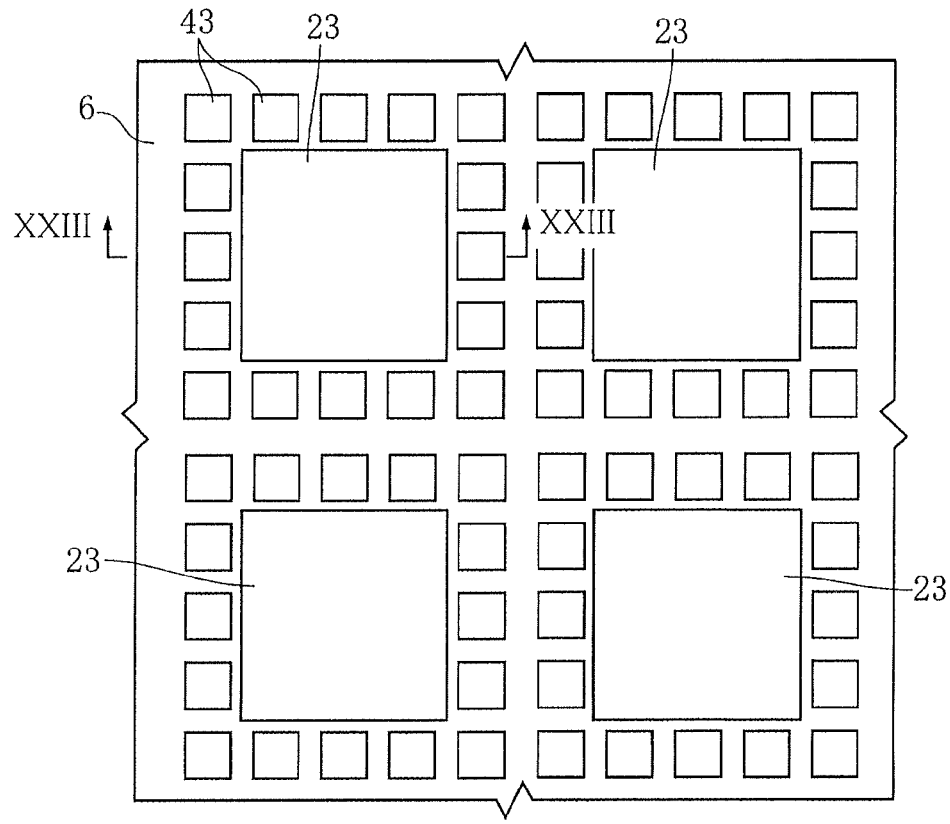
FIG. 22 is a plan view of a primary portion, showing a state that first semiconductor chips are mounted according to the embodiment of the method of making the semiconductor device in FIG. 18.
Figure 23:
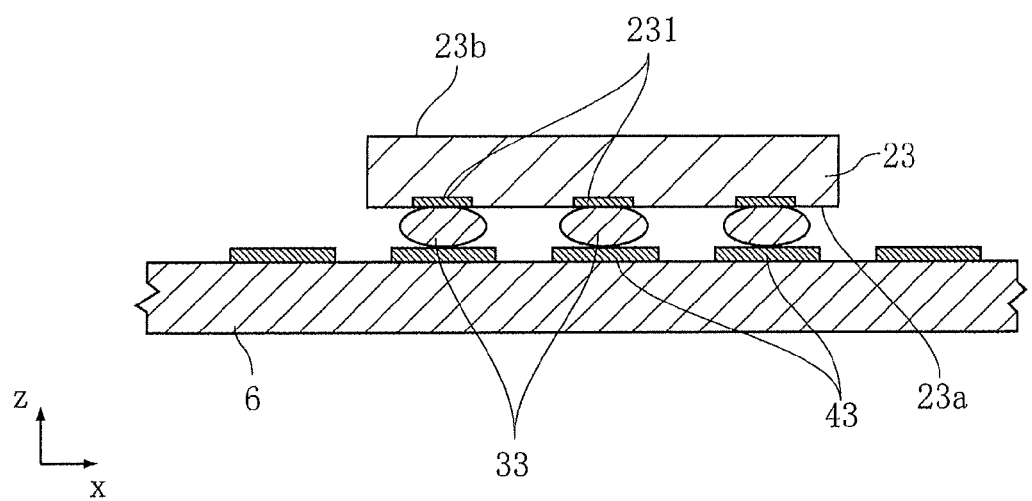
FIG. 23 is a sectional view taken in lines XXIII-XXIII in FIG. 22.

Next, a step of placing semiconductor chips 23 on the base 6 is performed. FIGS. 22 and 23 show a state where the semiconductor chips 23 are placed on the base 6. This step can be performed by using a common, solder bump formation technique. When this technique is used, solder bumps are formed on nine of the terminals 43 in the center region, and then the bumps are aligned with electrode terminals 231. The electroconductive bonding members 33 are provided by the solder bumps formed in this step.

Figure 24:
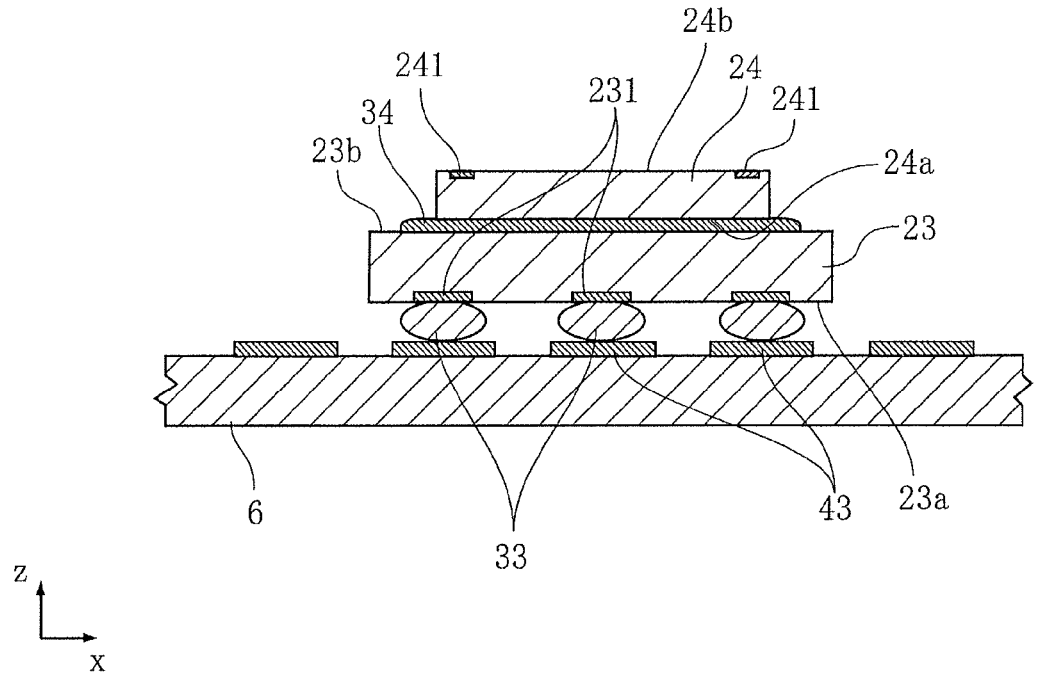
FIG. 24 is a sectional view of a primary portion, showing a state that a second semiconductor chip is mounted according to the embodiment of the method of making the semiconductor device in FIG. 18.

Next, a step of placing a semiconductor chip 24 on the semiconductor chip 23 is performed. FIG. 24 shows a state where the semiconductor chip 24 is placed on the semiconductor chip 23. In this step, first, a DAF tape is applied on the bottom surface 24a of each semiconductor chip 24. Next, as shown in FIG. 24, a semiconductor chip 25 is placed on a top surface 23b of each semiconductor chip 23. The DAF tape mentioned above serves as the fixing member 34.

Figure 25:
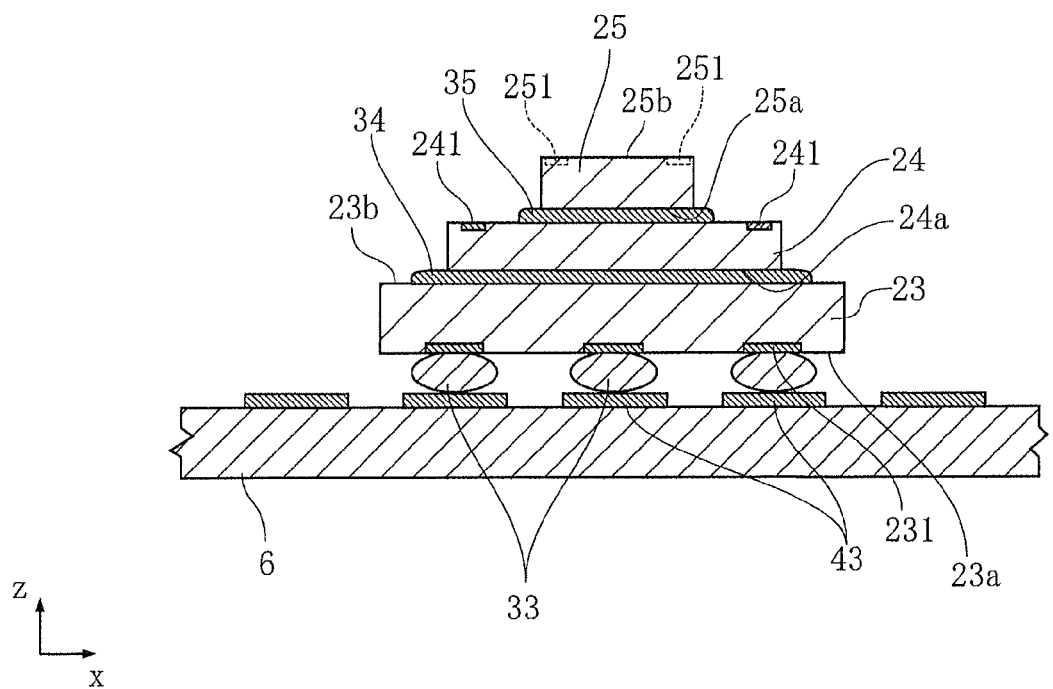
FIG. 25 is a sectional view of a primary portion, showing a state that a third semiconductor chip is mounted according to the embodiment of the method of making the semiconductor device in FIG. 18.

Next, a step of placing a semiconductor chip 25 on the semiconductor chip 24 is performed. FIG. 25 shows a state where the semiconductor chip 25 is placed on the semiconductor chip 24. In this step, first, a DAF tape is applied on the bottom surface 25a of the semiconductor chips 25. Next, as shown in FIG. 25, a semiconductor chip 25 is placed on a top surface 24b of each semiconductor chip 24. The DAF tape mentioned above serves as the fixing member 35.

Figure 26:
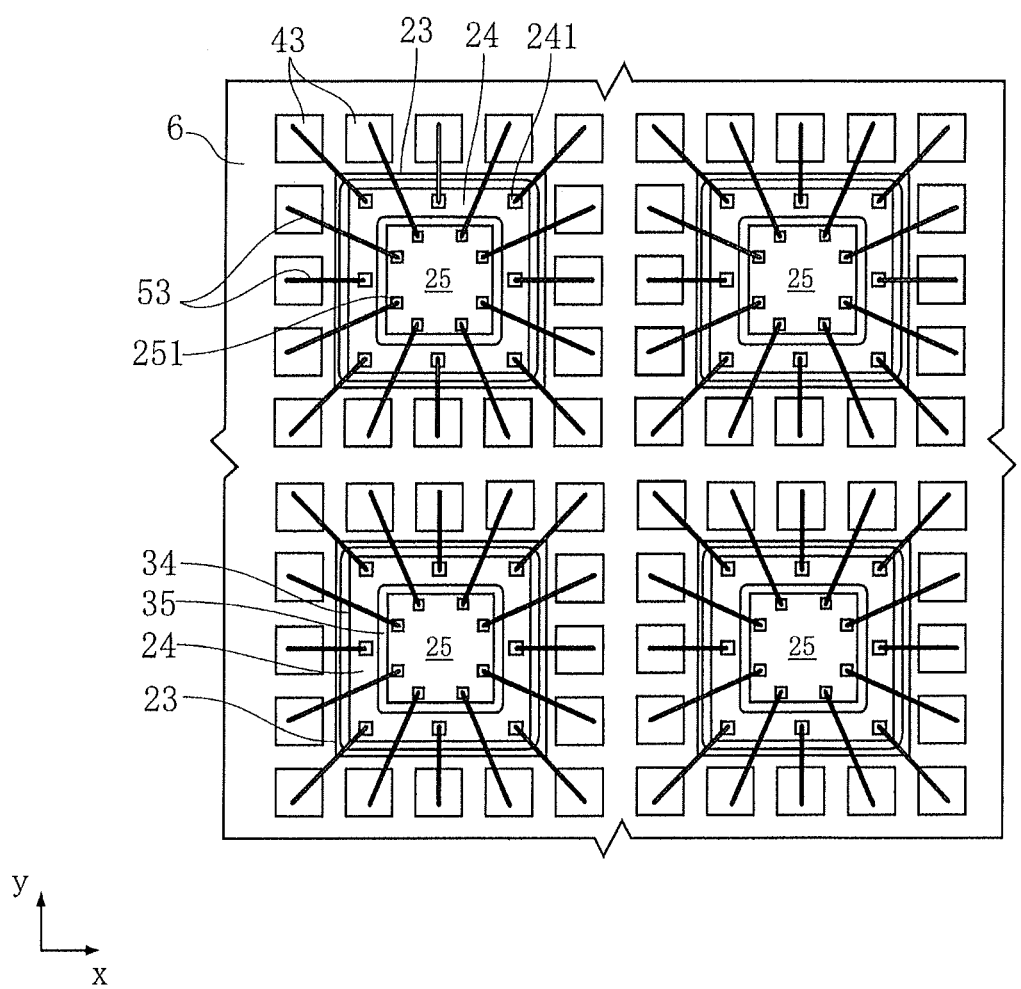
FIG. 26 is a plan view of a primary portion, showing a state that the second and the third semiconductor chips are connected with the terminals via wires according to the embodiment of the method of making the semiconductor device in FIG. 18.

Next, a step of connecting the semiconductor chips 24, with the terminals 43 using wires 53 is performed. FIG. 26 shows a state after the wires 53 are connected. In this step, each of the electrode terminals 241, 251 is connected with one of the terminals 43 which are disposed around the semiconductor chip 23, using a wire 53. This step can be performed by using a commercially available wire bonding capillary for example.

Next, a step of forming a sealing resin 1 is performed. This step can be performed in the same way as described for the method of making the semiconductor device A1, i.e. the step can be performed by a transfer molding method for example.

Next, a step of removing the base 6 is performed. This step can be performed in the same way as described for the method of making the semiconductor device A1, i.e. the step can be performed by etching the base 6 from the bottom surface side. After the base 6 is removed, the sealing resin 1 is cut into pieces to obtain the semiconductor devices A5 shown in FIG. 18.

Next, the functions of the semiconductor device A5 and the method of making the device will be described.

The semiconductor device A5 is incorporated in a circuit substrate of a various kind of electronic devices. In order to decrease the size of the circuit board, it is effective to incorporate as many semiconductor chips within a given area. The semiconductor device A5 incorporates three semiconductor chips 23, 24, 25 stacked in direction z. The arrangement above serves to increase the number of semiconductor chips per unit area as compared to cases where three semiconductor chips 23, 24, 25 are individually sealed in a resin and then incorporated in an electronic circuit. Therefore, the semiconductor device A5 has a beneficial arrangement in decreasing the size of the circuit board.

Further, in the semiconductor device A5, some of the terminals 43 are disposed at places overlapped by the semiconductor chip 23 as viewed in direction z. This provides an advantage in decreasing the size of the semiconductor device A5 as viewed in direction z.

Still further, according to the semiconductor device A5, nine terminals 43 which are disposed at places overlapped by the semiconductor chip 23 as viewed in direction z are bonded to the electrode terminals 231 formed on the bottom surface 23a of the semiconductor chip 23 by the electroconductive bonding members 33. These nine terminals 43 are not prone to coming off from the sealing resin 1.

Figure 27:
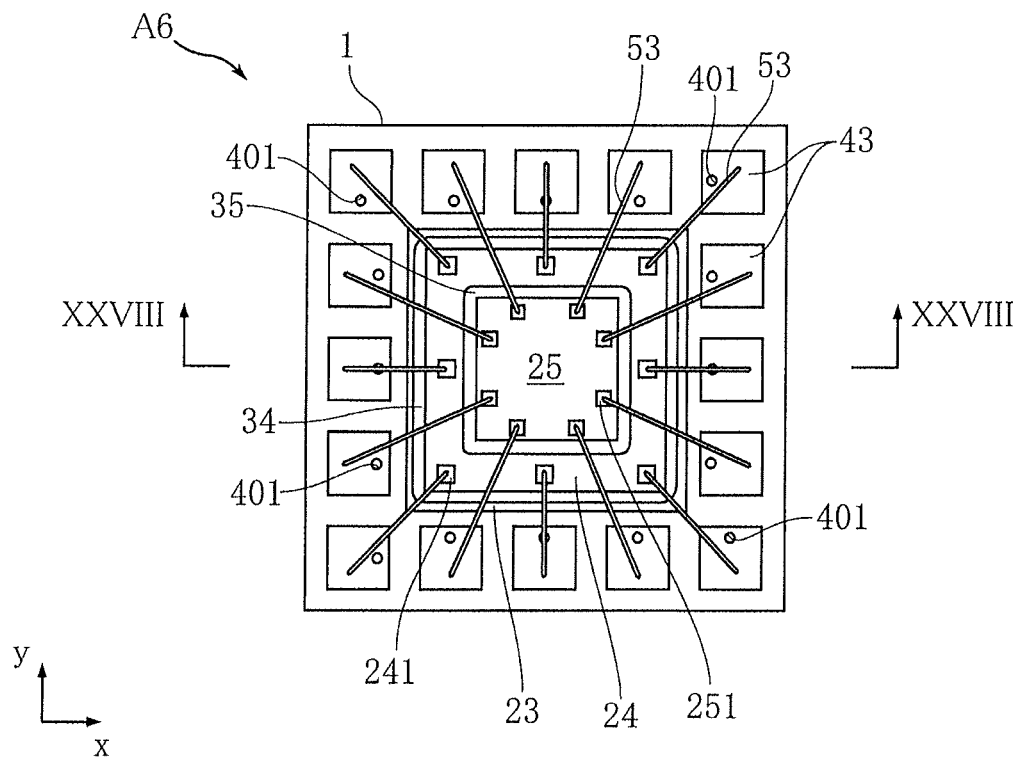
FIG. 27 is a plan view of a semiconductor device according to a sixth embodiment of the present invention.
Figure 28:
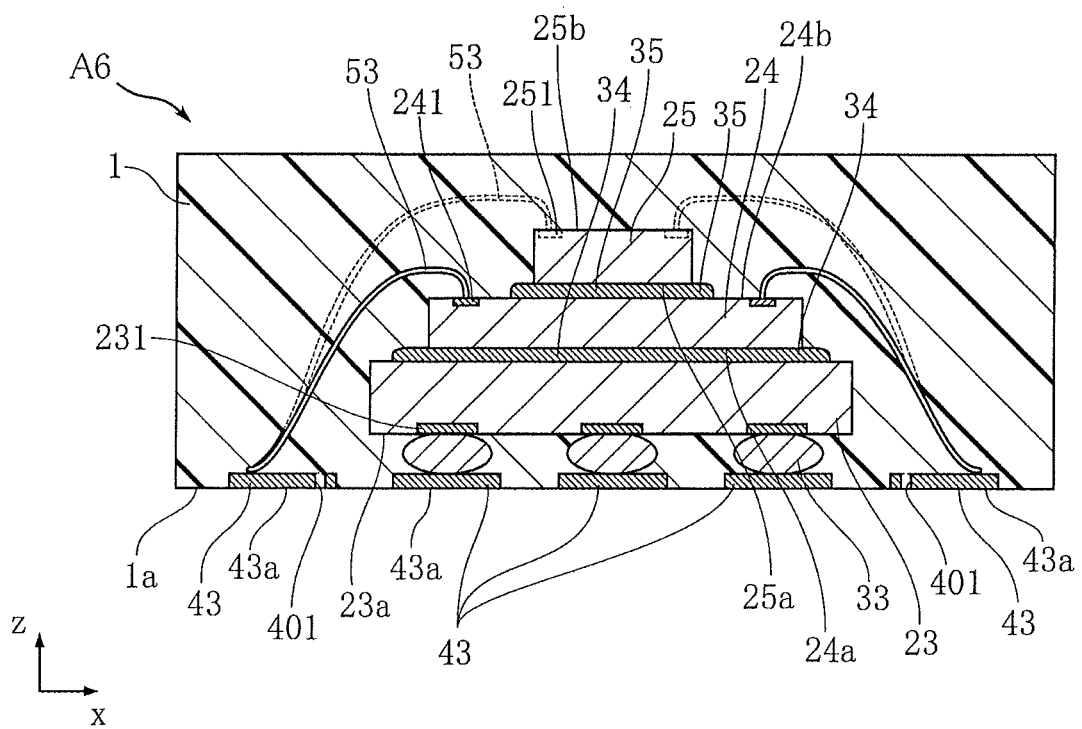
FIG. 28 is a sectional view taken in lines XXVIII-XXVIII in FIG. 27.

FIG. 27 and FIG. 28 show a semiconductor device according to a sixth embodiment of the present invention. The present embodiment offers a semiconductor device A6, in which some of the terminals 43 are formed with an opening 401 which is like the openings provided in the semiconductor devices A1 through A3. The other arrangements are identical with those in the semiconductor device A5.

As shown in FIG. 27, the opening 401 is formed in sixteen terminals 43 which are disposed around the semiconductor chip 23 and are connected with the wire 53. The openings 401 make these terminals 43 less prone to coming off from the sealing resin 1.

It should be noted here that as shown in FIG. 28, the opening 401 is not formed in nine terminals 43 disposed at places which are overlapped by the semiconductor chip 23 as viewed in direction z. Since these nine terminals 43 are bonded to the bottom surface 23a of the semiconductor chip 23 via the electroconductive bonding members 33, there is no need to form the openings 401.

Figure 29:
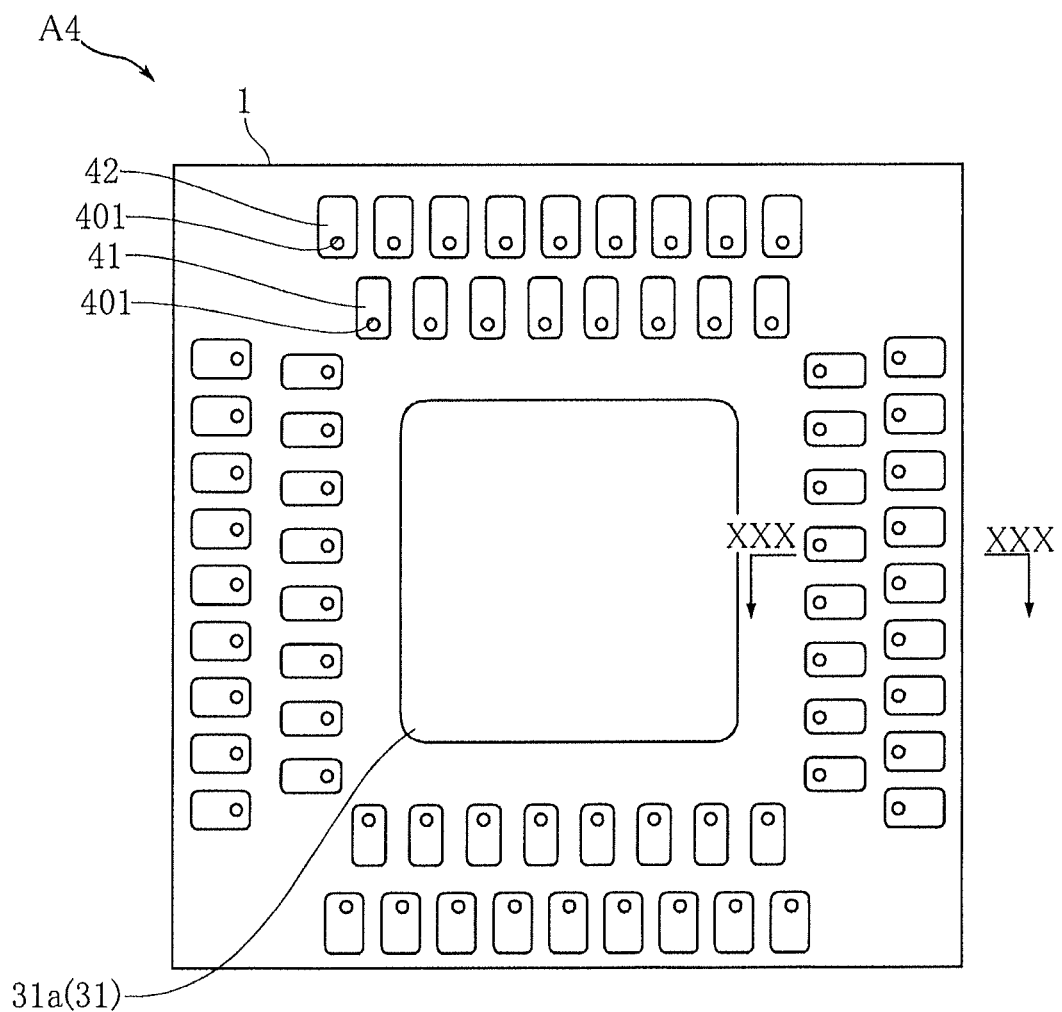
FIG. 29 is a bottom view of a semiconductor device as a variation of the fourth embodiment of the present invention.
Figure 30:
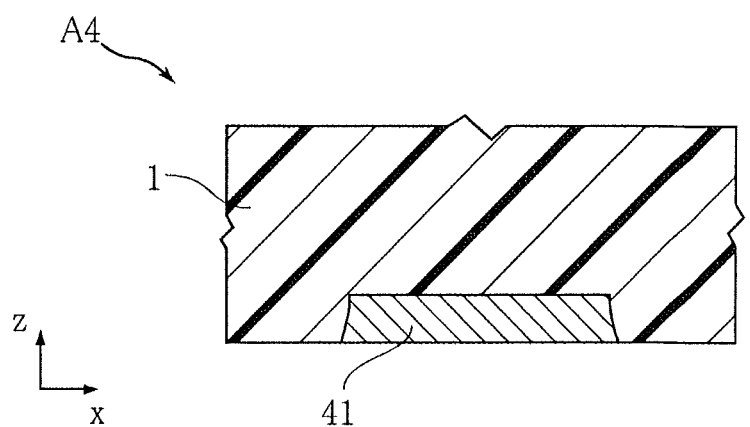
FIG. 30 is an enlarged sectional view taken in lines XXX-XXX in FIG. 29.

FIG. 29 and FIG. 30 show a variation of the semiconductor device A4 according to the fourth embodiment of the present invention. It should be noted here that FIG. 30 does not show wires 51 for easier understanding. As shown in FIG. 29, a plurality of terminals 41, 42 are each substantially rectangular as viewed in direction z, with their four corners rounded. These terminals 41, 42 are formed by e.g. the same technique as described above, i.e., by electroless plating to form a layer of metal, and then patterning the metal layer by etching. The four corners of the terminals 41, 42 are to become round in relation to the level of patterning accuracy, or the corners are made round intentionally. Typically, the support member 31 is formed in the manner described above, namely, by first applying an adhesive material such as a silver paste and then hardening the material. The support member 31, which is formed by using a coating step, also has four rounded corners.

FIG. 30 shows the section of the terminal 41. The terminal 42 also has the same sectional shape. The terminal 41 is substantially trapezoidal in section, with its upper surface being smaller in area than its lower surface, which is exposed from the sealing resin 1. The oblique sides of the trapezoid are curved, receding inward. The illustrated shape results from etching in the patterning step for forming the terminals 41, 42.

Figure 31:
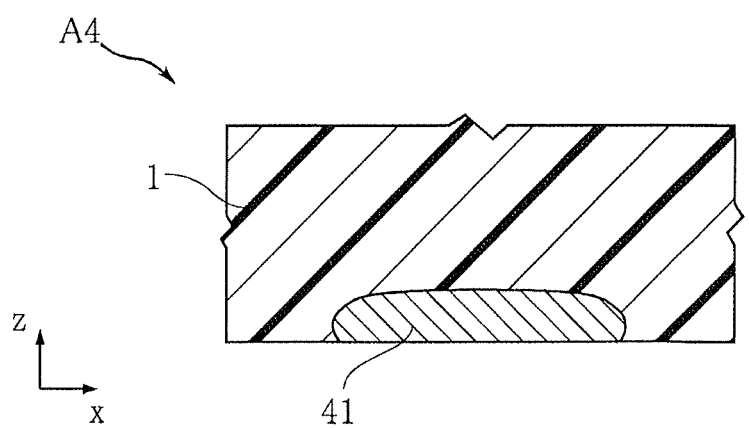
FIG. 31 is an enlarged sectional view of a semiconductor device as another variation of the fourth embodiment of the present invention.
Figure 32:
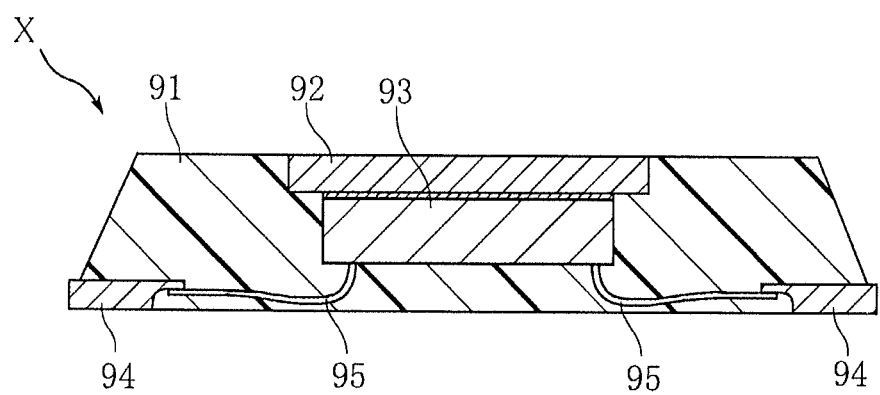
FIG. 32 is a sectional view of a conventional semiconductor device.

FIG. 31 shows another example of the sectional shape of the terminal 41. In this example, the terminal 41 has a sectional shape in which a portion covered by the sealing resin 1 is bulging in the left the right directions (in direction x or direction y) beyond the lower surface. Such a shape can result from the formation of the terminals 41, 42 by performing a plurality of selective plating processes to the terminal-forming regions, instead of performing the patterning of a metal layer by etching.

It should be noted here that the arrangements illustrated in FIG. 29 through FIG. 31 are applicable not only to the semiconductor device A4 but to the semiconductor devices A1-A3, A5 and A6.

Semiconductor devices according to the present invention or methods of making the semiconductor devices according to the present invention are not limited to the embodiments described thus far. The semiconductor and the method of making the same according to the present invention may be varied in many ways.

For example, although the semiconductor device A4 incorporates two semiconductor chips 21, 22, an additional semiconductor chip may be stacked on the top surface of the semiconductor chip 22 using a DAF tape.

The semiconductor device A5 described above incorporates three semiconductor chips 23, 24, 25. The semiconductor chip 25, however, may not be included, and the device may only incorporate two semiconductor chips 23 and 24.

The invention claimed is:

1. A semiconductor device comprising:
a semiconductor chip;
a terminal connected with the semiconductor chip and including a first surface and a second surface spaced from each other in a thickness direction; and
a sealing resin covering the semiconductor chip and the terminal, the sealing resin having a perimeter edge as viewed in a plan view;
wherein the sealing resin exposes the first surface of the terminal to an outside of the semiconductor device, and the terminal is formed with an opening filled with the sealing resin, and
an outermost edge of the exposed first surface is spaced inwardly from the perimeter edge of the sealing resin as viewed in the plan view.

2. The semiconductor device according to claim 1, wherein the opening extends throughout the terminal in the thickness direction.

3. The semiconductor device according to claim 1, wherein the opening is provided by a recess receding in a direction perpendicular to the thickness direction.

4. The semiconductor device according to claim 1, further comprising a wire connecting the semiconductor chip with the terminal, wherein the terminal has a pad area for the wire connection, and the pad area is farther than the opening is, from the semiconductor chip in a direction perpendicular to the thickness direction.

5. The semiconductor device according to claim 4, wherein the terminal is elongate in a first direction perpendicular to the thickness direction, and has a width in a second direction perpendicular to both the thickness direction and the first direction, the width decreasing as proceeding away from the semiconductor chip in the first direction.

6. The semiconductor device according to claim 1, further comprising a support member supporting the semiconductor chip, wherein the semiconductor chip includes a first surface and a second surface spaced from each other in the thickness direction, the first surface of the semiconductor chip being in contact with the support member, and wherein the support member includes a first surface and a second surface spaced from each other in the thickness direction, the first surface of the support member is exposed from the sealing resin.

7. The semiconductor device according to claim 6, wherein the support member contains silver.

8. The semiconductor device according to claim 1, wherein the terminal is formed of a plurality of metal layers.

9. A method of making a semiconductor device, the method comprising the steps of:

forming a terminal on a base;
placing a semiconductor chip on the base;
sealing the terminal and the semiconductor chip with a resin; and
removing the base;
wherein the forming of the terminal includes making an opening in the terminal for exposure of the base as viewed in a thickness direction of the base.

10. The method of making a semiconductor device according to claim 9, wherein the forming of the terminal includes performing an electroless plating process to the base.

11. A semiconductor device comprising:
a plurality of terminals;
a first semiconductor chip;
a second semiconductor chip on the first semiconductor chip; and
a sealing resin covering the first semiconductor chip, the second semiconductor chip, and the terminals;
wherein the terminals include a first terminal connected with the first semiconductor chip and a second terminal connected with the second semiconductor chip, and wherein each of the terminals includes a first surface and a second surface spaced from each other in a thickness direction, the first surface of each of the terminals being exposed to an outside of the semiconductor device from the sealing resin,
wherein the sealing resin has a perimeter edge as viewed in a plan view, and
an outermost edge of the exposed first surface of each of the terminals is spaced inwardly from the perimeter edge of the sealing resin as viewed in the plan view.

12. The semiconductor device according to claim 11, further comprising a support member supporting the first semiconductor chip, wherein the first semiconductor chip includes a first surface and a second surface spaced from each other in the thickness direction, the first surface of the first semiconductor chip being in contact with the support member, and wherein the support member includes a first surface and a second surface spaced from each other in the thickness direction, the first surface of the support member being exposed from the sealing resin.

13. The semiconductor device according to claim 12, wherein the support member contains silver.

14. The semiconductor device according to claim 12, further comprising a first wire, wherein the second surface of the first semiconductor chip is provided with a first electrode terminal, and the first wire connects the first electrode terminal with the first terminal.

15. The semiconductor device according to claim 11, wherein the first terminal is formed with an opening filled with the sealing resin.

16. The semiconductor device according to claim 11, further comprising an electroconductive bonding member for connecting the first terminal with the first semiconductor chip, wherein the first terminal is overlapped by the first semiconductor chip as viewed in the thickness direction,
the first semiconductor chip includes a first surface and a second surface spaced from each other in the thickness direction, the first surface of the first semiconductor chip being provided with a first electrode terminal, and
the electroconductive bonding member is in contact with both the first electrode terminal and the first terminal.

17. The semiconductor device according to claim 11, further comprising a second wire, wherein the second semiconductor chip includes a first surface and a second surface spaced from each other in the thickness direction, the first surface of the second semiconductor chip being fixed to the first semiconductor chip, the second surface of the second semiconductor chip being provided with a second electrode terminal, and wherein the second wire connects the second electrode terminal with the second terminal.

18. The semiconductor device according to claim 11, further comprising a fixing member connecting the second semiconductor chip with the first semiconductor chip.

19. The semiconductor device according to claim 17, wherein the second terminal is formed with an opening filled with the sealing resin.

20. The semiconductor device according to claim 11, wherein each of the terminals is formed of a plurality of metal layers.

21. A method of making a semiconductor device, the method comprising the steps of:
forming a plurality of terminals on a base;
placing a first semiconductor chip on the base;
placing a second semiconductor chip on the first semiconductor chip;
sealing the first semiconductor chip, the second semiconductor chip and the terminals with a resin; and
removing the base,
wherein the forming of the terminals includes making an opening in each of the terminals for exposure of the base as viewed in a thickness direction of the base.

22. The method of making a semiconductor device according to claim 21, wherein the forming of the plurality of terminals includes performing an electroless plating process to the base.

23. The method of making a semiconductor device according to claim 21, wherein the first semiconductor chip includes a first surface and a second surface spaced from each other in a thickness direction of the plurality of terminals, the second surface being farther from the base than the first surface is, the second surface being provided with a first electrode terminal, wherein the placing of the first semiconductor chip on the base includes: bonding the first surface of the first semiconductor chip to the base by a bonding member; and connecting the first electrode terminal with one of the plurality of terminals by a first wire.

24. The method of making a semiconductor device according to claim 21, wherein the first semiconductor chip includes a first surface and a second surface spaced from each other in a thickness direction of the terminals, the second surface being farther from the base than the first surface is, the first surface being provided with a first electrode terminal, and wherein the placing of the first semiconductor chip on the base includes connecting the first electrode terminal with one of the terminals by an electroconductive bonding member.

25. The method of making a semiconductor device according to claim 21, wherein the second semiconductor chip includes a first surface and a second surface spaced from each other in a thickness direction of the terminals, the second surface being farther from the base than the first surface is, the second surface of the second semiconductor chip being provided with a second electrode terminal, and the second electrode terminal is connected with one of the terminals by a second wire.

26. A semiconductor device comprising:
a plurality of terminals;
a first semiconductor chip;
a second semiconductor chip on the first semiconductor chip;
a third semiconductor chip on the second semiconductor chip; and a sealing resin covering the first semiconductor chip, the second semiconductor chip, the third semiconductor chip and the terminals;

wherein the terminals include a first terminal connected with the first semiconductor chip, a second terminal connected with the second semiconductor chip, and a third terminal connected with the third semiconductor chip, and each of the terminals includes a first surface and a second surface spaced from each other in a thickness direction, the first surface of each of the terminals is exposed to an outside of the semiconductor device from the sealing resin, wherein the sealing resin has a perimeter edge as viewed in a plan view, and an outermost edge of the exposed first surface of each of the terminals is spaced inwardly from the perimeter edge of the sealing resin as viewed in the plan view.

27. The semiconductor device according to claim 26, further comprising an electroconductive bonding member for connecting the first semiconductor chip with the first terminal, wherein the first terminal is overlapped by the first semiconductor chip as viewed in the thickness direction, and wherein the first semiconductor chip includes a first surface and a second surface spaced from each other in the thickness direction, the first surface being provided with a first electrode terminal, and wherein the electroconductive bonding member is in contact with both the first electrode terminal and the first terminal.

28. The semiconductor device according to claim 26, further comprising a support member supporting the first semiconductor chip, wherein the first semiconductor chip includes a first surface and a second surface spaced from each other in the thickness direction, the first surface of the first semiconductor chip being in contact with the support member, and wherein the support member includes a first surface and a second surface spaced from each other in the thickness direction, the first surface of the support member is exposed from the sealing resin.

29. The semiconductor device according to claim 28, wherein the support member contains silver.

30. The semiconductor device according to claim 28, further comprising a first wire, wherein the second surface of the first semiconductor chip is provided with a first electrode terminal, and the first wire connects the first electrode terminal with the first terminal.

31. The semiconductor device according to claim 26, wherein the first terminal is formed with an opening filled with the sealing resin.

32. The semiconductor device according to claim 26, further comprising a second wire, wherein the second semiconductor chip includes a first surface and a second surface spaced from each other in the thickness direction, the first surface of the second semiconductor chip being fixed to the first semiconductor chip, and wherein the second surface of the second semiconductor chip is provided with a second electrode terminal, and the second wire connects the second electrode terminal with the second terminal.

33. The semiconductor device according to claim 26, further comprising a first fixing member for connecting the second semiconductor chip with the first semiconductor chip.

34. The semiconductor device according to claim 32, wherein the second terminal is formed with an opening filled with the sealing resin.

35. The semiconductor device according to claim 26, further comprising a third wire, wherein the third semiconductor chip includes a first surface and a second surface spaced from each other in the thickness direction, the first surface of the third semiconductor chip being fixed to the second semiconductor chip, the second surface of the third semiconductor chip being provided with a third electrode terminal, the third wire connecting the third electrode terminal with the third terminal.

36. The semiconductor device according to claim 26, further comprising a second fixing member connecting the third semiconductor chip with the second semiconductor chip.

37. The semiconductor device according to claim 35, wherein the third terminal is provided with an opening filled with the sealing resin.

38. The semiconductor device according to claim 26, wherein each of the terminals is formed of a plurality of metal layers.

* * * * *